United States Patent [19]
Ai et al.

[11] Patent Number: 5,019,482
[45] Date of Patent: May 28, 1991

[54] POLYMER/OXIME ESTER/COUMARIN COMPOUND PHOTOSENSITIVE COMPOSITION

[75] Inventors: Hideo Ai; Nobuhiko Suga; Satoshi Ogitani; Hideaki Takahashi; Akihiko Ikeda, all of Fuji, Japan

[73] Assignee: Asahi Kasei Kogyo Kabushiki Kaisha, Osaka, Japan

[21] Appl. No.: 228,416

[22] Filed: Aug. 5, 1988

[30] Foreign Application Priority Data

Aug. 12, 1987 [JP] Japan ................................. 62-199920
Aug. 19, 1987 [JP] Japan ................................. 62-204276

[51] Int. Cl.⁵ .............................................. G03F 7/031
[52] U.S. Cl. ..................... 430/283; 430/281; 430/284; 522/14; 522/16; 522/17; 522/18; 522/137; 522/142; 522/162
[58] Field of Search ................. 522/18, 137, 142, 162, 522/17, 16, 14; 430/906, 281, 283, 284, 288

[56] References Cited

U.S. PATENT DOCUMENTS

| 3,558,309 | 1/1971 | Laridon et al. | 430/281 |
| 4,147,552 | 4/1979 | Specht. | |
| 4,282,309 | 8/1981 | Laridon et al. | 430/281 |
| 4,289,844 | 9/1981 | Specht et al. | 430/281 |
| 4,414,312 | 11/1983 | Goff | 430/283 |
| 4,430,418 | 2/1984 | Goff | 430/288 |
| 4,451,551 | 5/1984 | Kataoka et al. | 430/270 |
| 4,454,220 | 6/1984 | Goff | 430/311 |
| 4,481,340 | 11/1984 | Minnema et al. | 430/283 |
| 4,551,552 | 11/1985 | Fryd et al. | 430/283 |
| 4,702,997 | 10/1987 | Ai et al. | 430/284 |
| 4,778,859 | 10/1988 | Ai et al. | 430/283 |
| 4,849,051 | 7/1989 | Ahne et al. | 430/283 |

FOREIGN PATENT DOCUMENTS

| 254230 | 1/1988 | European Pat. Off. . | |
| 0276816 | 7/1988 | European Pat. Off. | 430/281 |
| 61-118423 | 6/1986 | Japan . | |

Primary Examiner—Marion E. McCamish
Assistant Examiner—Christopher D. RoDee
Attorney, Agent, or Firm—Irwin M. Aisenberg

[57] ABSTRACT

A photosensitive composition comprising:
(a) a polymer
(b) 1 to 20% by weight, based on the weight of polymer (a), of a compound having a terminal ethylenically unsaturated group;
(c) 0.1 to 20% by weight, based on the weight of polymer (a), of an oxime ester compound
(d) 0.01 to 10% by weight, based on the weight of polymer (a), of a coumarin compound having a wave length of the absorption peak of 330 to 550 nm; has high photosensitivity to an actinic light of a wave length of 400 to 500 nm and is capable of forming heat-resistant images, patterns or films.

24 Claims, No Drawings

POLYMER/OXIME ESTER/COUMARIN COMPOUND PHOTOSENSITIVE COMPOSITION

BACKGROUND OF THE INVENTION

1. Field of the Invention

The present invention relates to a novel photosensitive composition. More specifically it relates to a novel photosensitive composition capable of forming fine patterns by a light of a wave length of 330 to 550 nm and transforming into a heat-resistant polymeric material.

Heretofore, making the most of their heat-resistant property and electrical property, heat-resistant polymeric materials, typical of which are polyimides, are widely used as structural materials, printed circuit boards, heat-resistant insulating materials in the fields of electric, automobile, aeronautical, aerospace or nuclear power engineering.

On the other hand, photosensitive polymeric materials are widely used as coating materials and printing plates. Especially in recent years, making the most of their lithographic property, they have made a conspicuous achievement as fine processing materials, including resists for making printed circuits and semiconductor elements and resists for metal plate etching. Recently, extensive studies have been made to develop polymeric materials having these two useful functions, i.e., heat-resistance and photosensitivity for use as electronic or optical components. Such components include surface-protecting films, such as junction coatings, passivation films, buffer coatings and α-particle protecting films; insulation films for semiconductor devices, such as insulation films between layers for multilayer circuits; molecular-oriented films for liquid crystal display devices; and insulation films for thin-film magnetic heads or for multilayer printed circuit boards [see, for example, *Functional Materials*, July, pages 9-19 (1983) and *Photographic Science and Engineering*, pages 303-309 (1979)].

2. Description of the Prior Art

Heretofore, as the heat-resistant photosensitive compositions are known compositions capable of forming a crosslinked structure by actinic irradiation which comprise a polymer prepared by introducing an active functional group, such as a double bond-containing group, onto the ester side chains of a polyamic acid which is a polyimide precursor, a photosensitizer and a polymerizable monomer (U.S. Pat. No. 3,957,512 and U.S. Pat. No. Re. 30186). These compositions are basic compositions for heat-resistant polymeric materials for lithography, typical of which are so-called photosensitive polyimides. However, they are low in photosensitivity and not sufficient for practical purposes. As a composition which improves this defect, a composition comprising a polyamic acid (whose active functional group at its side chains is a methacrylate group or an acrylate group) and an azide compound, such as p-acetamidephenylsulfoneazide, as the photopolymerization initiator is proposed (U.S. Pat. No. 4,292,398). Although the photosensitivity of this composition is improved to some extent, it is still insufficient. On the other hand, in order to increase photosensitivity, compositions comprising an ethylenically unsaturated compound and an oxime ester compound (U.S. Pat. No. 3,558,309) or comprising a polyimide precursor and an oxime ester compound as the photopolymerization initiator (European Pat. No. 025230A) are proposed. These compositions, however, have either no or low photosensitivity to the g-line (wavelength : 436 nm) of a super high pressure mercury arc lamp. Also photosensitive compositions comprising a coumarin compound having a maximum absorption to a certain wave length (U.S. Pat. Nos. 4,147,552), but these compositions have some photosensitivity to the g-line which is still insufficient for practical purposes. In addition, photosensitive compositions comprising, as the main component, a mixture of a polyamic acid and an amine compound having an active functional group, such as a double bond, are proposed. However, they are solutions whose viscosity is very high, such solutions must thus be employed at low concentrations. When a spin coater and the like, which are widely employed for preparing a film on the surface of semiconductor elements, are employed, it is difficult to form a thick film from them. Further, when these compositions are left to stand after coating and drying, cracks are disadvantageously easily formed by moisture absorption due to the component capable of forming an ion bond contained therein.

Typically, the photosensitive compositions disclosed in the above described prior art are coated as solutions on a substrate, dried, exposed to actinic light, such as ultra violet rays, through a photomask and developed with a suitable developing solvent to remove unexposed portions by dissolution. Then the images thus obtained are subjected to the treatment at high temperatures to be transformed into a heat-resistant structure, such as an imide structure, and simultaneously to vaporize the volatile components, such as the side chain of the polyamic acid, the crosslinking chain and the initiator, resulting in a heat-resistant film of the images. According to conventional technology, however, when such photosensitive compositions are exposed to actinic light by using a stepper of g-line (wavelength : 436 nm) of a super high pressure mercury arc lamp which is an exposure device most popularly employed in a step of the production of LSI devices, the photosensitivity of the compositions is nil or very low and the exposure time required for hardening becomes long. Thus such compositions may be said to have a great disadvantage in view of the efficient application of such an expensive exposure device and the throughput of products.

Further, the combination of an oxime compound having a specific structure and a photosensitizer having absorption in the region of specific wave lengths is found to increase the photosensitivity of the composition by the inventors of the present invention. This combination, however, has no or insufficient photosensitivity to an actinic light of a wave length of 400 to 500 nm.

SUMMARY OF THE INVENTION

It is an object of the present invention to provide a photosensitive composition having high photosensitivity to an actinic light of a wave length of 400 to 500 nm, in particular, to the exposure to actinic light by a g-line stepper, the composition being capable of forming heat-resistant images, patterns or films.

Other objects of the present invention will become apparent from the following description.

According to the present invention there is provided a photosensitive composition capable of forming fine patterns by an actinic light of a wave length of 400 to 500 nm which comprises:

(a) a polymer having recurring units represented by the formula $$-X-Z-Y- \quad\quad [I]$$
$$\phantom{-X-}|\phantom{Z}| $$
$$\phantom{-X-}(A)_m\phantom{Z}(W)_n$$

wherein
X is a (2+m) valent $C_{6-30}$ carbocyclic group or heterocyclic group;
Y is a (2+n) valent $C_{6-30}$ carbocyclic group or heterocyclic group;
Z is

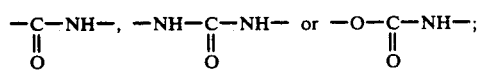

A is —COOR* or —COO⊖R**⊕ wherein each of R* and R** is a group having a carbon-carbon double bond;
W is a group capable of reacting with the carbonyl group of A to form a ring on heating;
A and W are arranged in ortho- or peri-position to Z;
m is 1 or 2; and n is 0, 1 or 2, (b) 1 to 20% by weight, based on the weight of polymer (a), of a compound having a terminal ethylenically unsaturated group;

(c) 0.1 to 20% by weight, based on the weight of polymer (a), of an oxime ester compound represented by the formula

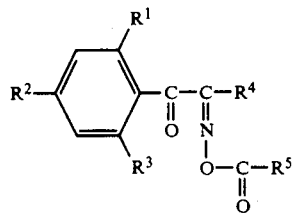

[II]

wherein
each of $R^1$, $R^2$ and $R^3$ is a hydrogen atom, a $C_{1-6}$ alkyl group, a $C_{1-6}$ alkoxy group or a nitro group;
$R^4$ is a $C_{7-11}$ aromatic acyl group, a $C_{2-7}$ aliphatic acyl group, a $C_{2-7}$ alkoxycarbonyl group, a $C_{6-10}$ aromatic sulfonyl group or a $C_{1-6}$ aliphatic sulfonyl group; and
$R_5$ is a $C_{1-6}$ alkyl group, a $C_{1-6}$ alkoxy group, a $C_{6-10}$ aromatic group or a $C_{6-10}$ aryloxy group; and (d) 0.01 to 10% by weight, based on the weight of polymer (a), of a coumarin compound having a wave length of the absorption peak of 330 to 550 nm

DESCRIPTION OF THE PREFERRED EMBODIMENTS

The polymer used as component (a) in the photosensitive composition of the present invention having recurring units represented by the above described formula, wherein X is a tri- or tetra-valent $C_{6-30}$ carbocyclic or heterocyclic group. Examples of X are a tri- or tetra-valent aromatic ring, such as a benzene ring and a toluene ring; a tri- or tetra-valent condensed polycyclic ring, such as a naphthalene ring and an anthracene ring; a tri- or tetra-valent heterocyclic group, such as pyridine, methylpyridine and thiophene; and a group having the following formula

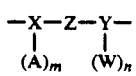 [Ia]

wherein
l is zero or one;
$X^1$ is

—$(CH_2)_T$—, —$(O)_2$—

[structures with $X^2$, C, and phenyl rings]

wherein l is zero or one, $$-\underset{\underset{CH_3}{|}}{\overset{\overset{CH_3}{|}}{C}}-,\ -\underset{}{\overset{\overset{O}{\|}}{C}}-,\ -S-,\ -\underset{\underset{O}{\|}}{\overset{\overset{O}{\|}}{S}}-,\ -O-\ \text{or}$$

[diphenyl sulfide structure: —O—phenyl—S—phenyl—O—]

and
$X^2$ is —$CH_3$ or —$CF_3$.
of these groups as X, preferred are

[series of structures: two benzene rings; then biphenyl-type structures with —$CH_2$—, —C(=O)—, —S(=O)$_2$—, —O—, —C($CF_3$)$_2$—, and biphenyl linkages]
, and Y in formula [I] is a di-, tri-or tetra-valent $C_{6-30}$ carbocyclic or heterocyclic group. Examples of Y are a di-, tri- or tetra-valent $C_{10-18}$ condensed polycyclic ring, such as a naphthalene ring and an anthracene ring; a di-, tri- or tetra-heterocyclic ring derived from pyridine and imidazole and the groups represented by the following formulae

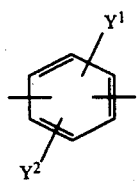
[Ib]

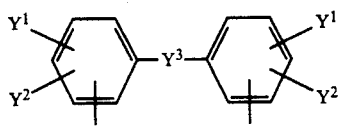
[Ic]

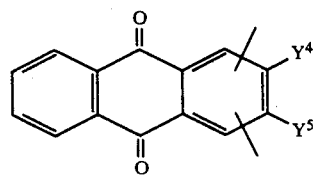
[Id]

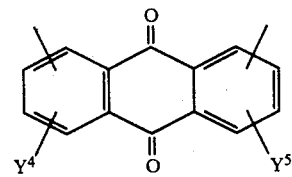
[Ie]

and

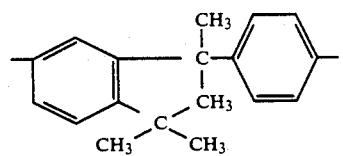
[If]

wherein
Y¹ and Y² each is a hydrogen atom, —CH₃, —C₂H₅, —CH(CH₃)₂, —OCH₃, —COOH, —NO₂, —CONH₂, —NH₂, a halogen atom or —SO₃H;
Y³ is —(CH₂)ₚ— wherein p is zero or one;

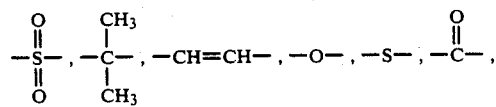

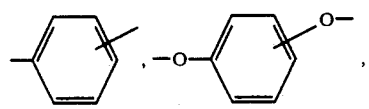

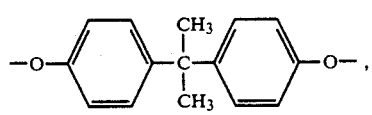

-continued

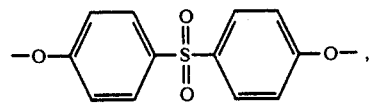

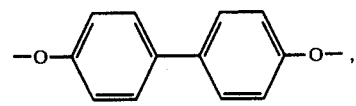

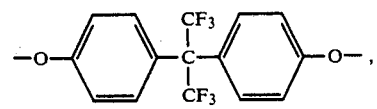

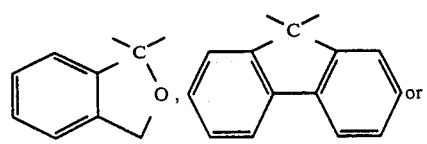

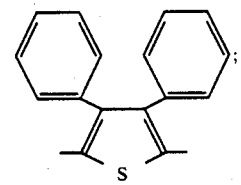
or

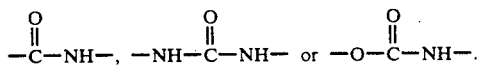

Y⁴ and Y⁵ each is a hydrogen atom, —CN, a halogen atom, —CH₃, —OCH₃, —SO₃H, —NH₂, —COOH or —CONH₂.

of these groups as Y preferred are groups represented by formula [Ib] and [Ic].

Z in formula [I] is

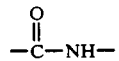

Of these group preferred is

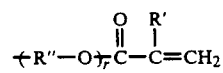

which is capable of transforming into an imide ring in the heat treatment.

R* in A of formula [I] is a group having a carbon-carbon double bond. Such groups include the ones represented by the following formulae

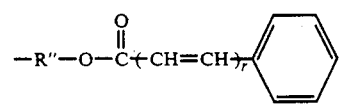
[Ig]

[Ih]

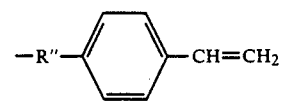
[Ii]

-continued

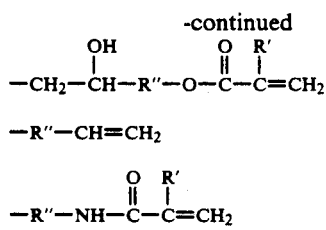

wherein
R' is a hydrogen atom or a methyl group;
R" is a C$_{1-3}$ alkylene group; and
r is one or two.
Exemplary groups [Ig] to [Il] include

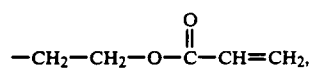

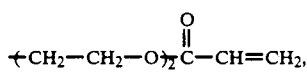

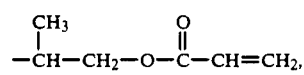

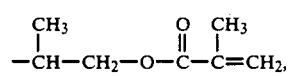

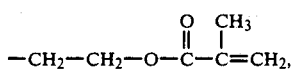

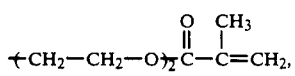

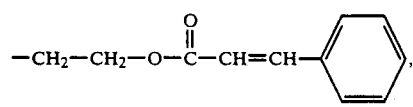

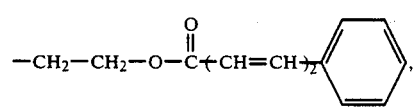

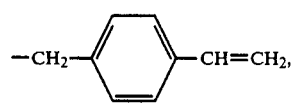

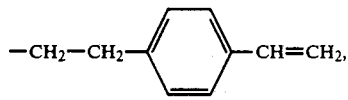

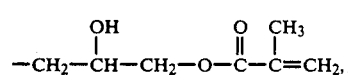

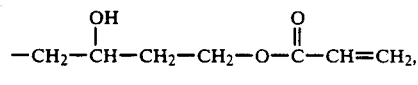

—CH$_2$—CH=CH$_2$, —CH$_2$—CH$_2$—CH=CH$_2$,

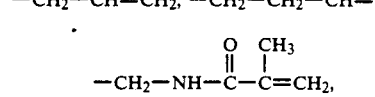

and

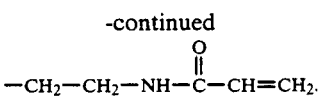

Of these groups preferred are

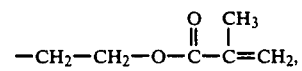

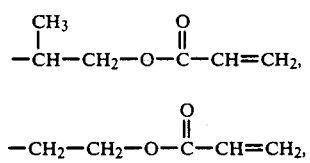

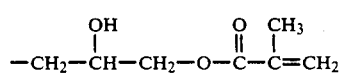

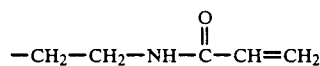

and

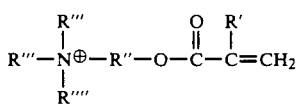

in view of the photosensitivity and storage stability of the polymer.

When A in formula [I] is —COO$^{\ominus}$R$^{\oplus}$, R$^{\oplus}$ is a group having a carbon-carbon double bond represented by the formula

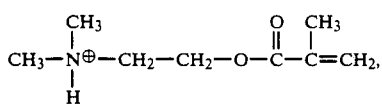   [Im]

wherein
R' and R" are the same as defined in formulae [Ig] to [Il];
R''' is a methyl group or an ethyl group; and
R'''' is a hydrogen atom or a methyl group.
Preferred examples of such groups are

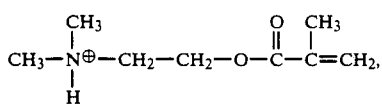

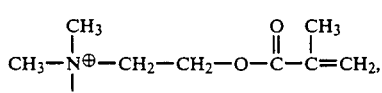

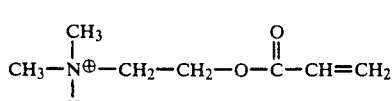

and

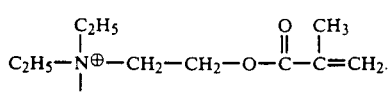

W is a group capable of reacting with the carbonyl group of A to form a ring in the heat treatment. Preferred examples of such groups are —NH$_2$ and

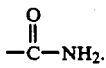

The compound having a terminal ethylenically unsaturated group which is employed as component (b) in the photosensitive composition of the present invention not only improves the photosensitivity of the composition but also imparts sufficient adhesiveness to the composition. The terminal ethylenically unsaturated group of the compound is represented by the formula,

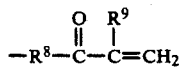

wherein
$R^8$ is —O— or —NH— and $R^9$ is a hydrogen atom or a methyl group, and a preferred terminal ethylenically unsaturated group is an acryloxy group, i.e., $R^8$ is —O— and $R^9$ is a hydrogen atom in formula [IV] and preferred compounds have a plurality of acryloxy groups. The compounds having at least one terminal ethylenically unsaturated group are typically low molecular weight monomeric compounds and oligomers having a molecular weight of 60 to 1,000.

Exemplary compounds having a terminal ethylenically unsaturated group include 2-ethylhexyl acrylate or methacrylate, 2-hydroxyethyl acrylate or methacrylate, carbitol acrylate or methacrylate, tetrahydrofurfuryl acrylate or methacrylate, isobornyl acrylate or methacrylate, 1,6-hexanediol diacrylate or methacrylate, neopentyl glycol diacrylate or dimethacrylate, ethylene glycol diacrylate or dimethacrylate, tetraethylene glycol diacrylate or dimethacrylate, nonaethylene glycol diacrylate or dimethacrylate, N-vinylpyrrolidone, methylenebisacrylamide, methylenebismethacrylamide and N-methylol acrylamide or methacrylamide, polyethylene glycol diacrylate or dimethacrylate (molecular weight 100–1,000), pentaerythritol triacrylate or trimethacrylate, dipentaerythritol hexaacrylate or hexamethacrylate, tetramethylolpropane tetraacrylate or tetramethacrylate, N-vinylpyrrolidone, methylenebisacrylamide, methylenebismethacrylamide, N-methylolacrylamide and N-methylolmethacrylamide.

The oxime ester compound (c) which is employed as a photoinitiator in the photosensitive composition of the present invention is represented by

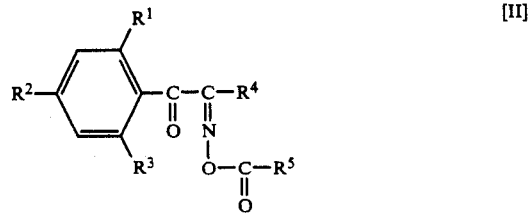

wherein
each of $R^1$, $R^2$ and $R^3$ is a hydrogen atom, a $C_{1-6}$ alkyl group, a $C_{1-6}$ alkoxy group or a nitro group;
$R^4$ is a $C_{7-11}$ aromatic acyl group, a $C_{2-7}$ aliphatic acyl group, a $C_{2-7}$ alkoxycarbonyl group, a $C_{6-10}$ aromatic sulfonyl groups or a $C_{1-6}$ aliphatic sulfonyl group; and
$R_5$ is a $C_{1-6}$ alkyl group, a $C_{1-6}$ alkoxy group, a $C_{6-10}$ aromatic group or a $C_{6-10}$ aryloxy group.

Preferred $R^1$, $R^2$ and $R^3$ are each a hydrogen atom, a methyl group, an ethyl group, a methoxy group, an ethoxy group and a nitro group. Preferred $R^4$ are a benzoyl group, a toluoyl group, an acetyl group, a propionyl, an ethoxycarbonyl group, a benzenesulfonyl group, a toluenesulfonyl group, a methanesulfonyl group and an ethanesulfonyl group. Preferred $R^5$ are an ethyl group, butyl groups, a methoxy group, an ethoxy group, a phenyl group, tolyl groups and a phenoxy group.

Exemplary oxime esters include

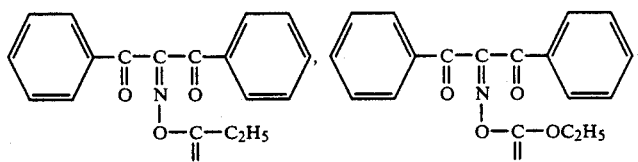

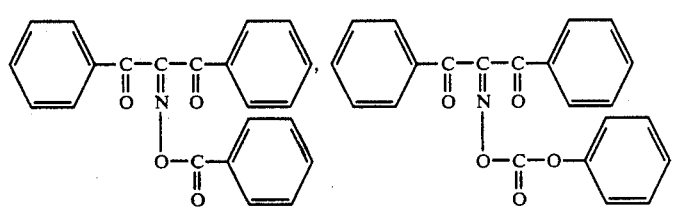

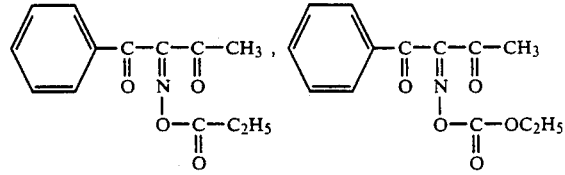

-continued
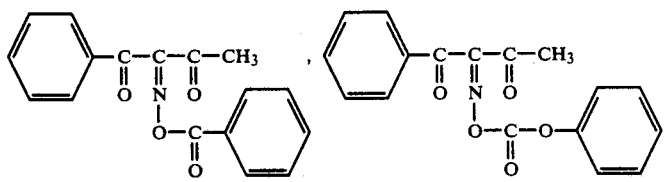
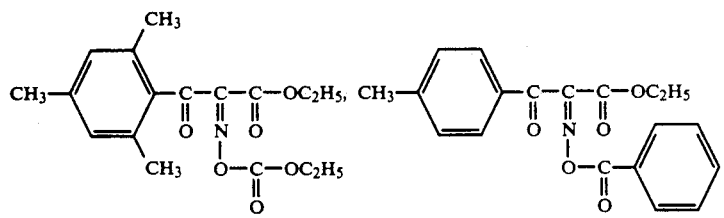
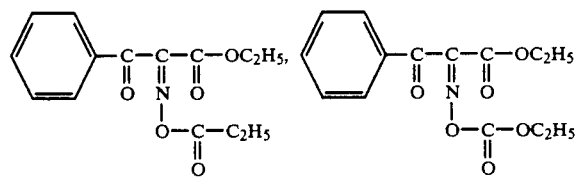
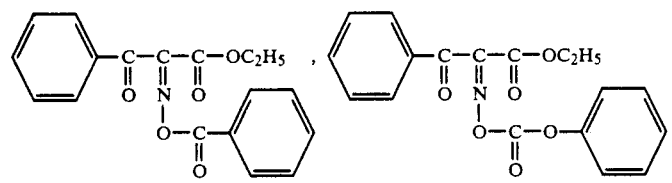
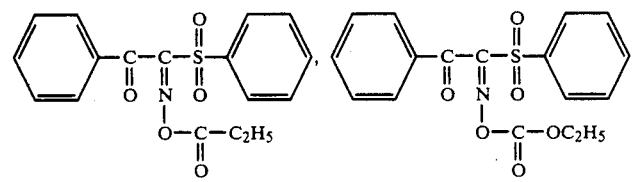
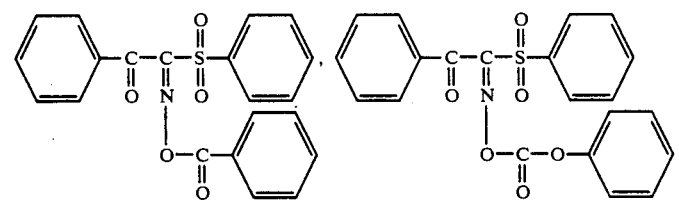
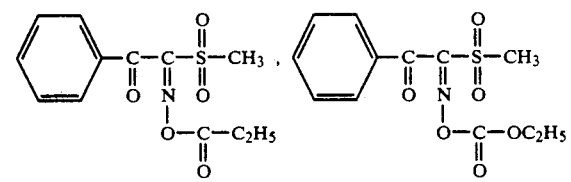
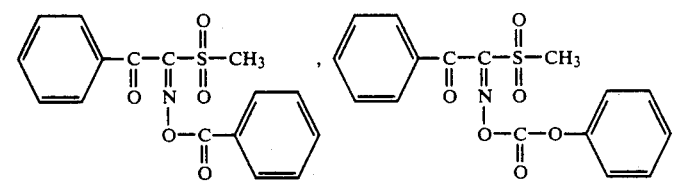

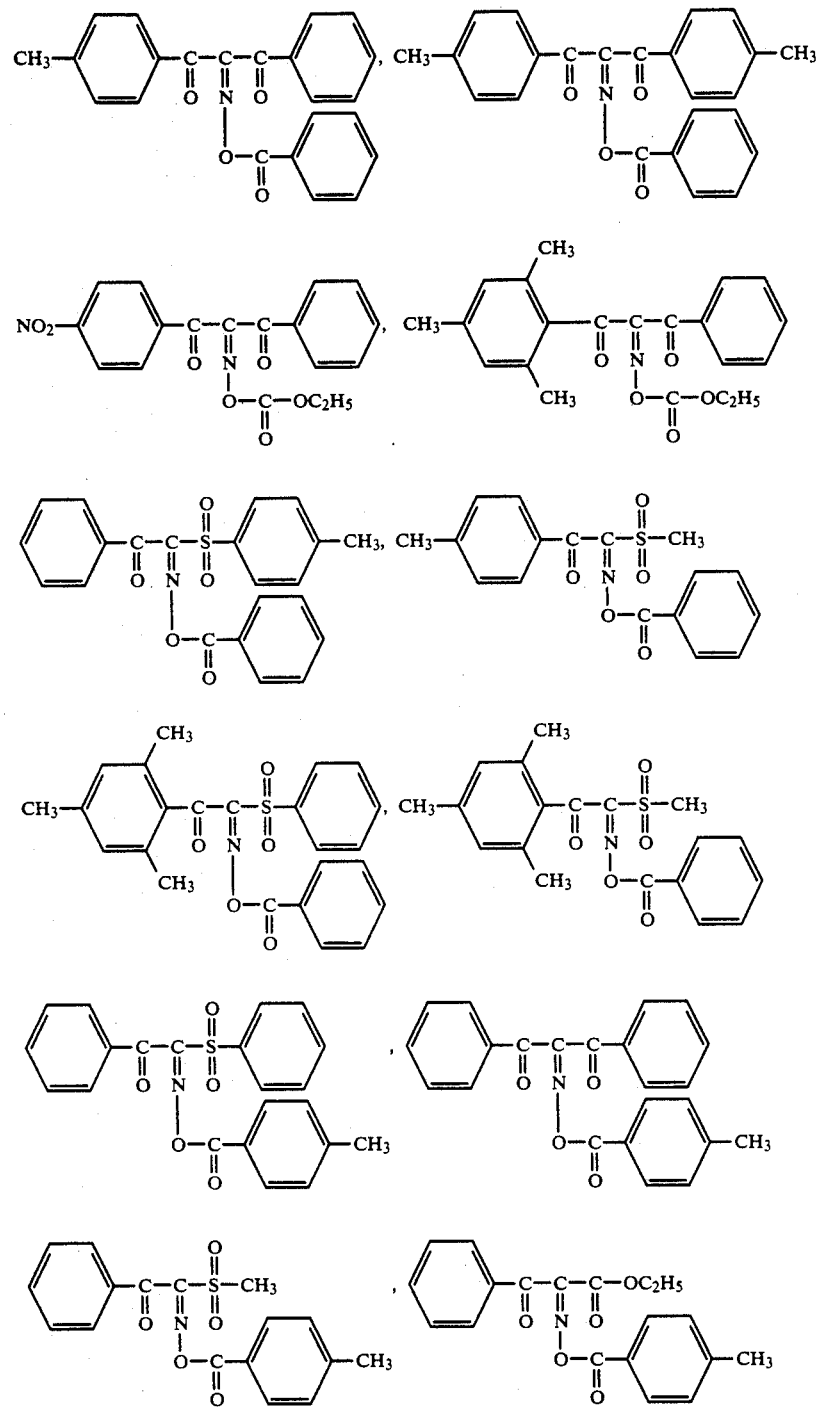

These oxime ester compounds may be employed singly or in combination.

The oxime ester compound which is employed as component (c) can be prepared by firstly converting a compound to an oxime compound according to the method described in ORGANIC SYNTHESIS, Vol. 40, pp 21~23 and ORGANIC SYNTHESIS Collective Vol. 3, pp 513~516 and secondly reacting the oxime compound with an acid chloride or an acid anhydride.

The coumarin compound (d) which is employed as a photosensitizer in the photosensitive composition of the present invention is a compound having a wave length of the absorption peak of 330 to 550 nm. Suitable examples of such coumarin compounds include the compounds represented by the following formulae

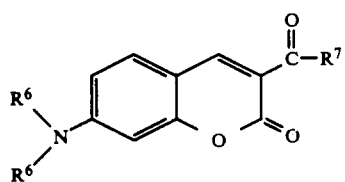 [IIIa]

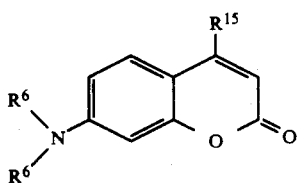 [IIIb]

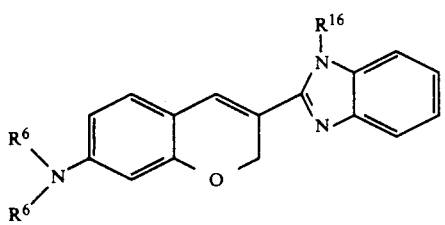 [IIIc]

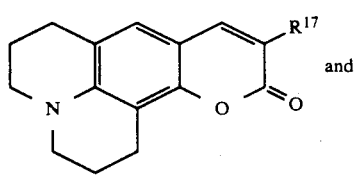 and [IIId]

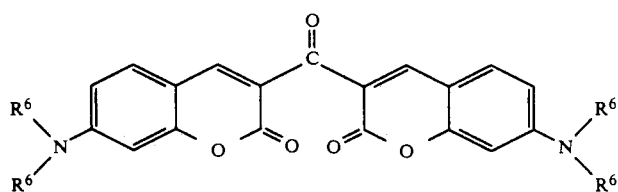 [IIIe]

wherein
$R^6$ is a methyl group or an ethyl group;
$R^7$ is a $C_{1-4}$ alkyl group, a $C_{6-10}$ aromatic hydrocarbon group or a $C_{1-7}$ alkoxy group;
$R^{15}$ is a methyl group, an ethyl group or a trifluoromethyl group;
$R^{16}$ is a hydrogen atom or a methyl group; and
$R^{17}$ is an ethoxycarbonyl group, a cyano group, a tert-butoxycarbonyl group or an acetyl group or a carboxyl group.

Exemplary coumarin compounds include

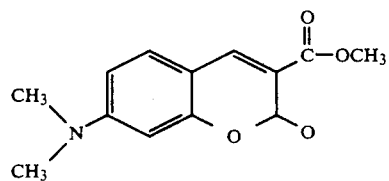 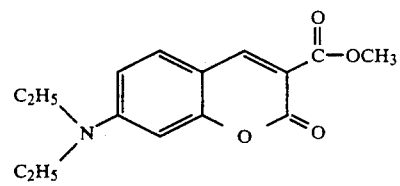

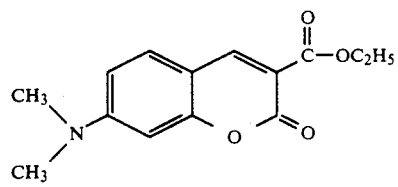 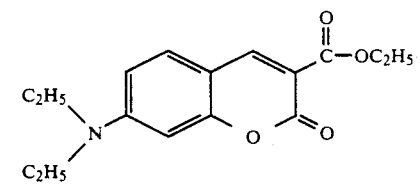

-continued
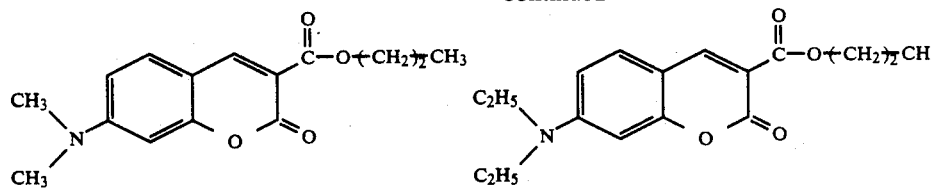
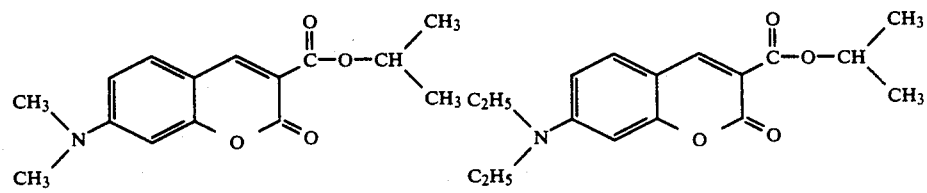
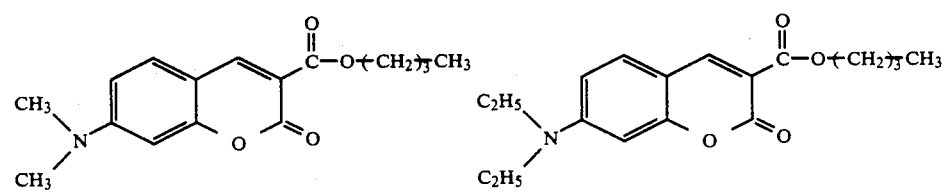
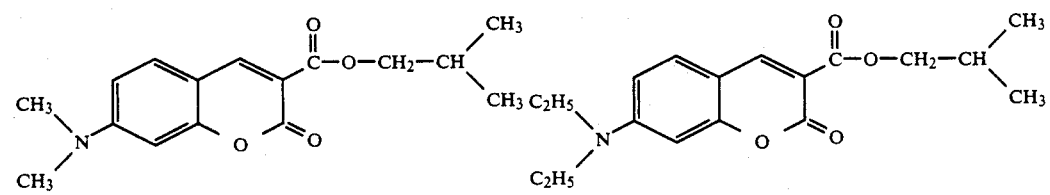
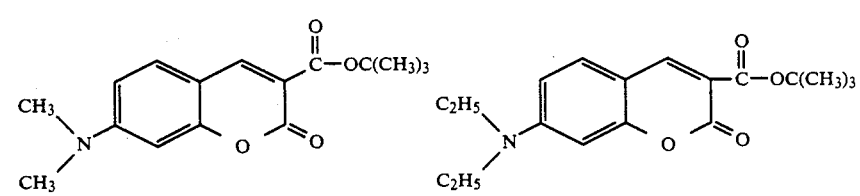
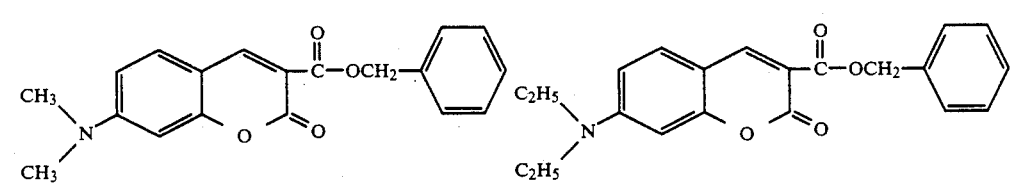
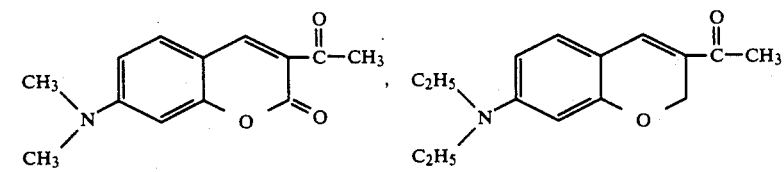
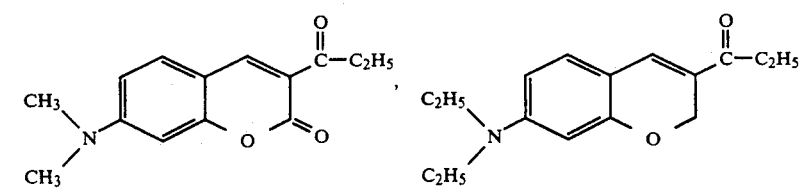
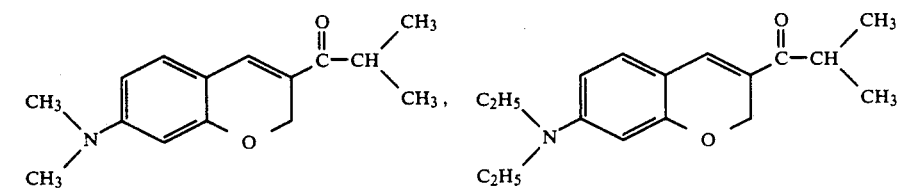

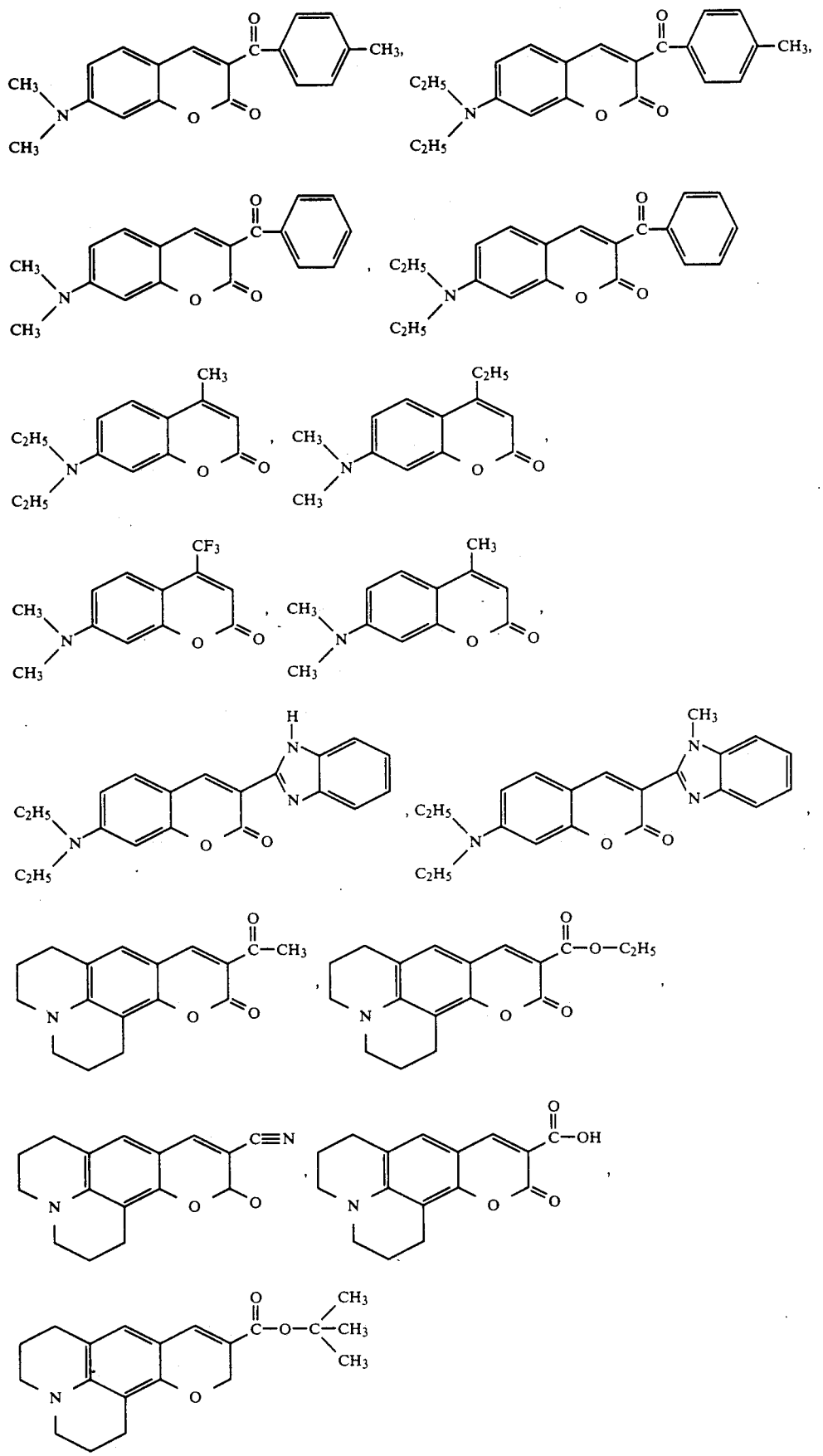

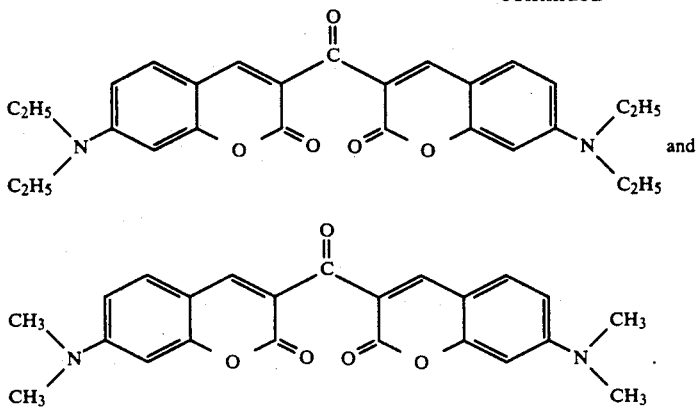

These coumarin compounds may be employed singly or in combination.

Of these coumarin compounds, the compounds represented by formula [IIIa] are preferred in view of the photosensitivity of the photosensitive composition of the present invention.

The coumarin compound which is employed as compound (d) can be prepared by the ring-forming reaction of a dialkylaminosalicyl aldehyde and a ↑-ketonic ester according to the methods described in ORGANIC REACTIONS Vol. 15, pp 204-273.

Of the coumarin compounds of formulae [IIIa] to [IIIe] as described above, the coumarin compounds of formula [IIIa] further improve the photosensitivity of the photosensitive composition of the present invention to g-line.

The amount of the compound having a terminal ethylenically unsaturated group used as component (b) in the photosensitive composition of the present invention is 1 to 20% by weight, preferably 1 to 10% by weight based on the weight of the polymer as component (a). The amount of the oxime ester compound used as component (c) is 0.1 to 20% by weight, preferably 1 to 15% by weight based on the weight of the polymer as component (a). When the amount is less than 0.1% by weight, the photosensitivity is insufficient. On the other hand, amounts of more than 20% by weight decrease the film or membrane properties after the heat treatment. The amount of the coumarin compound used as component (d) is 0.01 to 10% by weight, preferably 0.05 to 5% by weight based on the weight of the polymer. When the amount is less than 0.01% by weight, the photosensitivity is insufficient. On the other hand, amounts of more than 10% by weight decrease the photosensitivity.

The addition of an aromatic compound represented by the formula

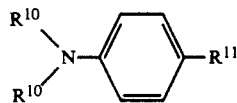

wherein $R^{10}$ is a $C_{1-3}$ alkyl group, a $C_{1-3}$ hydroxyalkyl group or a morpholino group; $R^{11}$ is a $C_{1-3}$ alkyl group, a $C_{2-5}$ alkylcarbonyl group or a $C_{7-10}$ arylcarbonyl group, further increases the sensitivity to an actinic light having a wave length of 400 to 500 nm. Of these compounds represented by formula [V], preferred compounds are 4-dimethylaminoacetophenone, 4-morpholinoacetophenone, 4-dimethylaminobenzophenone, 4-morpholinobenzophenone, N-phenyldiethanolamine, N-p-tolyldiethylamine and N-p-tolyldiethanolamine.

In addition, the use of a mercapto-containing aromatic heterocyclic compound in the photosensitive composition can further improve the photosensitivity of he composition. Exemplary mercapto-containing aromatic heterocyclic compounds include 2-mercaptobenzimidazole, 2-mercaptobenzothiazole, 1-phenyl-5-mercapto-1H-tetrazole, 2-mercapto-4-phenylthiazole, 2-amino-5-mercapto-4-phenylthiazole, 2-amino-4-mercapto-1,3,4-thiazole, 2-mercaptoimidazole, 2-mercapto-5-methyl-1,3,4-thiazole, 5-mercapto-1-methyl-1H-tetrazole, 2,4,6-trimercapto-s-triazine, 2-dibutylamino-4,6-dimercapto-s-triazine, 2,5-dimercapto-1,3,4-thiadiazole, 5-mercapto-1,3,4-thiadiazole, 1-ethyl-5-mercapto-1,2,3,4-tetrazole, 2-mercapto-6-nitrothiazole, 2-mercaptobenzoxazole, 4-phenyl-2-mercaptothiazole, mercaptopyridine, 2-mercaptoquinoline, 1-methyl-2-mercapotimidazole and 2-mercapto-β-naphthothiazole. The amount of the mercapto-containing aromatic heterocyclic compound employed is typically at most 10% by weight, preferably at most 5% by weight, based on the weight of the polymer as component (a).

If necessary or desired, a silane compound represented by the formula

wherein each of $R^{12}$ and $R^{13}$ is a $C_{1-6}$ alkyl group; $R^{14}$ is a hydrocarbon group which may have an oxygen atom, a nitrogen atom or a sulfur atom;

and c is 3 and d is 0 or c is 2 and d is 1, can be added to the photosensitive composition of the present invention or pre-coated on a substrate. This silane compound can improve the adhesiveness of the interface between the photosensitive composition of the present invention and silicon or an inorganic insulating film or membrane as a substrate. Exemplary silane compounds include γ-aminopropylmethyldimethoxysilane, γ-aminopropylmethyldiethoxysilane, γ-aminopropyltrimethoxysilane, γ-aminopropyltriethoxysilane, N-(β-aminoethyl)-γ-aminopropylmethyldimethoxysilane, N-(β-aminoethyl)-γ-aminopropylmethyldiethoxysilane, N-(β-aminoethyl)-γ-aminopropyltrimethoxysilane, N-

(β-aminoethyl)-γ-aminopropyltriethoxysilane, γ-glycidoxypropylmethyldimethoxysilane, γ-glycidoxypropylmethyldiethoxysilane, γ-mercaptopropylmethyldimethoxysilanesilane, γ-mercaptopropylmethyldiethoxysilane, 3-methacryloxypropyldimethoxymethylsilane, 3-methacryloxypropyldiethoxymethylsilane, 3-methacryloxypropyltrimethoxysilane, 3-methacryloxypropyltriethoxysilane, dimethoxymethyl-3-piperidinopropylsilane, diethoxymethyl-3-piperidinopropylsilane, N-(3-dimethoxymethylsilylpropyl)succinimide, N-(3-diethoxymethylsilylpropyl)succinimide, phenyldimethoxymethylsilane and phenyldiethoxymethylsilane.

When the silane compound is used, its amount is typically 0.05 to 10% by weight, preferably 0.1 to 5% by weight, based on the weight of the polymer as component (a).

Furthermore, in order to improve the storage stability of the solution of the photosensitive composition according to the present invention, a polymerization inhibitor can be added to the composition. Exemplary polymerization inhibitors include hydroquinone, N-nitrosodiphenylamine, p-tert-butylcatechol, phenothiazine, N-phenylnaphthylamine and 2,6-di-tertbutyl-p-methylphenol. The amount of the polymerization inhibitor employed is typically at most 5% by weight, preferably at most 0.5% by weight, based on the weight of the polymer as component (a).

The polymer used as component (a) in the photosensitive composition can be prepared by the condensation polymerization or the addition polymerization of a compound represented by the formula

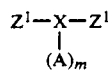   [VII]

and a compound represented by the formula

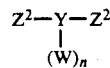   [VIII]

In formulae [VII] and [VIII], $Z^1$ is —COOH, —COCl, —NCO, —NH$_2$ or —OH; $Z^2$ is —COCl, —COOH, —NCO or —NH$_2$; and X, Y, m and n are the same as defined above.

Z is formed by the reaction of $Z^1$ and $Z^2$ in the condensation polymerization or the addition of the compound of formula [VII] and the compound of formula [VIII]. In this reaction preferred combinations of $Z^1$ and $Z^2$, types of Z formed and ring structures formed in the heat treatment of the resultant polymers are set forth in Table 1.

TABLE 1

| No. | $Z^1$ | $Z^2$ | Z | Ring structure |
|---|---|---|---|---|
| 1 | —COOH | —NH$_2$ | O<br>‖<br>—C—NH— | imide ring |
| 2 | —COCl | " | " | " |
| 3 | —COCl | —NCO | " | " |
| 4 | —NCO | —COOH | " | — |
| 5 | —NH$_2$ | —NCO | O<br>‖<br>—NH—C—NH— | quinazoline dione ring |

TABLE 1-continued

| No. | $Z^1$ | $Z^2$ | Z | Ring structure |
|---|---|---|---|---|
| 6 | —NH$_2$ | —COOH | O<br>‖<br>—C—NH— | — |
| 7 | —OH | —NCO | O<br>‖<br>—O—C—NH— | oxazine dione ring |

The polymer as component (a) can be prepared by reacting one of the compounds represented by the formulae

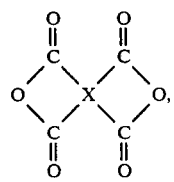   [IX]

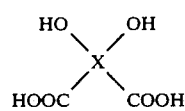   [X]

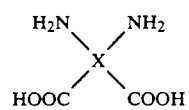   [XI]

wherein
X is the same as defined above,
with a compound of formula [VIII] wherein $Z^2$ is —NCO or —NH$_2$, reacting the carboxyl group of the resultant compound with an epoxy compound represented by the formula

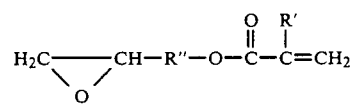   [XII]

wherein
R' and R" are the same as defined above;
or an amine compound represented by the formula

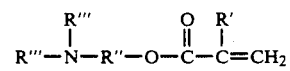   [XIII]

wherein
R' and R" are the same as defined above; and
R''' is a methyl group or an ethyl group.
or a quaternary ammonium salt represented by the formula

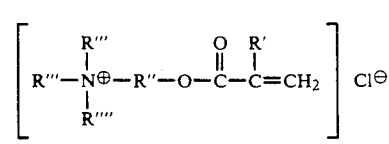   [XIV]

wherein
R', R" and R are the same as defined above; and
R'''' is a hydrogen atom or a methyl group.

The compound of formula [VII] wherein $Z^1$ is —COOH, for example, can be prepared by the ring-opening reaction of an acid dianhydride represented by formula [IX] as described above and an alcohol represented by the formula $$R^*OH \qquad [XV]$$

wherein

R* is the same as defined above.

Exemplary acid dihydrides of formula include pyromellitic dianhydride, 3,3',4,4'-benzophenonetetracarboxylic dianhydride, 3,3',4,4'-diphenyltetracarboxylic dianhydride, 3,3',4,4'-diphenylethertetracarboxylic dianhydride, 3,3',4,4'-diphenylsulfonetetracarboxylic dianhydride, 2,3,6,7-naphthalenetetracarboxylic dianhydride, thiophene-2,3,4,5-tetracarboxylic dianhydride and 2,2-bis(3,4-biscarboxyphenyl)propane dianhydride.

Exemplary alcohols of formula [XV] include 2-hydroxyethyl acrylate or methacrylate, 2-hydroxypropyl acrylate or methacrylate, allyl alcohol and ethylene glycol monoallylether.

The use of pyridine or dimethylpyridine in the reaction of the acid dianhydride of formula [IX] and the alcohol of formula [XV] accelerates the reaction.

Of the combinations of the compound of formula [VII] and the compound of formula [VIII], preferred is a combination of the formula [VII] wherein $Z^1$ is —COOH or —COCl and the compound of formula [VIII] wherein $Z^2$ is —NH₂.

In this combination, exemplary compounds of formula [VIII] wherein $Z^2$ is —NH₂ include 4,4'-diaminodiphenylether, 4,4'-diaminobiphenyl, 2,4-diaminotoluene, 4,4'-diaminobenzophenone, 4,4-diaminodiphenylsulfone, 9,10-bis(4-aminophenyl) anthracene, 4,4'-diaminodiphenylmethane, p-phenylenediamine, m-phenylenediamine, 1,5-diaminonaphthalene, 3,3'-dimethoxy-4,4'-diaminobiphenyl, 3,3'-dimethyl-4,4'-diaminobiphenyl, o-toluidinesulfone, 2,2-bis(4-aminophenoxyphenyl)propane, bis(4-aminophenoxyphenyl)sulfone, bis(4-aminophenoxyphenyl)sulfide, 1,4-bis(4-aminophenoxy)benzene, 1,3-bis(4-aminophenoxy)benzene, 3,4'-diaminodiphenylether, 9,9-bis(4-aminophenyl)fluorene, 3,3'-diaminodiphenylsulfone, 4,4'-di(3-aminophenoxy)-diphenylsulfone, 4,4'-diaminobenzanilide and 3,4'-diaminodiphenylelther.

The reaction of the compound of formula [VII] wherein $Z^1$ is —COOH and the compound of formula [VIII] wherein $Z^2$ is —NH₂ can be carried out by using a carbodiimide such as dicyclohexylcabodiimide as the dehydration condensing agent. Suitable solvents for this reaction are aprotic polar solvents including, for example, N,N-dimethylformamide, hexamethylphosphorotriamide, N-methylpyrrolidone, N,N-dimethylacetamide, tetrahydrofuran and γ-butyrolactone. The reaction is carried out at a temperature of −20° C. to 80° C., preferably −10° C. to 30° C., for 1 to 100 hours, preferably 2 to 24 hours, under continuous stirring. The method for preparing polyamides with the use of a carbodiimide is described in U.S. Pat. No. 4,645,823 and this method can be advantageously employed in this invention. According to this method the molecular weight of the polymers can be controlled by varying the mol ratio of the compound of formula [VII] wherein $Z^1$ is —COOH and the compound of formula [VIII] wherein $Z^2$ is —NH₂. Further, when the reaction is carried out by using an excess amount of one of these two compounds, it is preferred to add a capping agent for remaining terminals. As the capping agent preferred are alcohols such as methanol and ethanol and amines such as butylamint and aniline when the compound of formula [VII] is in excess. In separating the polymer formed from the reaction mixture, it is preferred to add an alcohol little by little to the reaction mixture. The purification of the polymer is carried out by dissolving the solid polymer thus separated in a solvent such as tetrahydrofuran and adding the solution little by little to water to precipitate a polymer.

The compound of formula [VII] wherein $Z^1$ is —COCl, can be prepared by the reaction of the half ester of the compound of formula [VII] wherein $Z^1$ is —COOH, and thionyl chloride or phosphorus pentachloride.

In the reaction of the compound of formula [VII] wherein $Z^1$ is COCl and the compound of formula [VIII] wherein $Z^2$ is —NH₂, the same solvent as used in the reaction of the compound of formula [VII] wherein $Z^1$ is —COOH and the compound of formula [VIII] wherein $Z^2$ is —NH₂, can be employed. However, when tetrahydrofuran or γ-butyrolactone is employed, it is necessary to employ an amine such as pyridine and triethylamine as the dehydrochlorining agent. In separating the polymer formed from the reaction mixture it is preferred to add the reaction mixture little by little to a large amount of water. The purification of the polymer is carried out by pulverizing the solid polymer thus separated and washing the pulverized polymer with water or by repeating the steps of dissolving the solid polymer in an organic solvent and adding the solution to water to precipitate a polymer.

The photosensitive composition of the present invention is made into a solution by dissolving all the components in a solvent and then coated on a substrate. In this instance, the substrate may be pre-coated with the above described silane compound in order to enhance the adhesion of the photosensitive composition to the substrate.

The solvent which can be preferably employed in the present invention is a polar solvent having a not too high boiling point. Such solvents include N,N-dimethylformamide, N-methylpyrrolidone, N,N-dimethylacetamide, diglyme, isobutyl acetate, cyclopentanone and mixtures thereof. Further, a solvent such as an alcohol, an aromatic hydrocarbon, an ether, a ketone and an ester can be added to the above described solvent in such an amount as not to precipitate the components of the photosensitive composition.

The solution thus obtained is filtered and then coated on a substrate by means of a spin coater, a bar coater, a blade coater, a roll coater or a spray or by screen printing or dipping the substrate in the solution, and then dried in air, with heating and/or in vacuum.

The substrate which can be preferably employed in the present invention is of a heat resistant material such as a metal, a glass, a silicon semiconductor, a chemical compound semiconductor, a metal oxide insulator and silicon nitride. Also a copper-lined glass epoxy laminate can be employed when the heat treatment is not conducted.

As the photosensitive composition of the present invention has high photosensitivity to an actinic light of a wave length of 330 to 550 nm, preferably 400 to 500 nm light sources having spectral lines in the region of this wave length are preferably employed. Exemplary light sources include a super high pressure mercury arc lamp and a xenon-mercury arc lamp which have g-line (wave length 436 nm), and h-line (wave lengh 405 nm) and i-line (wave length 365 nm), Ar ion laser and He-Cd laser which have several oscillating wave lengths in the region of a wave length of 330 to 550 nm. Of these light sources, a g-line stepper which is an exposure device selectively using the g-line of a super high pressure mercury arc lamp for exposure is preferably employed.

It is preferred that the exposure to an actinic light of a wave length of 330 to 550 nm is conducted in a nitrogen atmosphere.

After exposure the development is carried out by removing unexposed portions of the photosensitive composition with a developper by dipping or spraying. Preferred is a developer capable of compoletely removing the unexposed parts within a suitable period of time. Such developers are aprotic polar solvents including γ-butyrolactone, N-methylpyrrolidone, N-acetyl-2-pyrrolidone, N,N-dimethylformamide, N,N-dimethylacetamide, dimethyl sulfoxide, hexamethylphosphorotriamide and N-benzyl-2-pyrrolidone. The solvents can be used alone or in combination with a second solvent. Such second solvents are alcohols including ethanol and isopropanol; aromatic hydrocarbons including toluene and xylene; ketones including methylethyl ketone and methylisobutyl ketone; esters including ethyl acetate and methyl propionate; and ethers including tetrahydrofuran and dioxane.

Further, it is preferred to rinse the developed images or patterns with the above described second solvent immediately after the development.

After drying, the images or patterns thus obtained are transformed into polymers having heatresistant structural units of imide rings, oxazine dione rings and quinazoline dione rings in the heat treatment at a temperature of 150° C. to 450° C.

The photosensitive composition of the present invention has, as its advantage, high sensitivity to an actinic light of a wave length of typically 330 to 550 nm and preferably 400 to 500 nm, in particular, a g-line stepper for exposure. This originates from the use of the oxime ester compound (c) as the photoinitiator and the coumarin compound (d) as the photosensitizer in combination. The photosensitivity of the photosensitive composition of the present invention is at least two times higher that of the conventional photosensitive composition which uses a 3-ketocoumarin compound as the photosensitizer instead of the coumarin compound (d). Also the photosensitive composition of the present invention has remarkably improved lithographic properties which are important for the the properties of a photoresist. Thus the photosensitive composition of the present invention has ideal properties for a photoresist exhibiting high resolution in a small exposure dose. Furthermore, the photosensitive composition of the present invention has excellent storage stability for a long period of time and does not show the occurrence of infavorable gelation, cracks and surface films at coating and drying. Thus, when the photosensitive composition of the present invention is employed for the preparation of insulation films between layers for semiconductor elements and surface-protecting films, the process can be shortened and fine processing can be rendered easy due to the above described advantages, which can improve to a great extent the productivity of LSI devices in their complicated production steps.

The following Examples are given to illustrate the present invention more specifically. However, it should be understood that the invention is in no way limited by these Examples.

The polymers, compounds having a terminal ethylenically unsaturated group, oxime ester compounds, coumarin compounds, aromatic amine compounds, mercapto-containing heterocyclic compounds, silane compounds and photopolymerization initiators which were employed in the following examples are set forth in Table 2 to 11.

With respect to the index showing the molecular weight of the polymers as component (a) of the photosensitive composition of the present invention, viscosity number was employed. The viscosity number can be obtained by the following way. In 100 ml of N-methyl-2-pyrrolidone was dissolved 1 g of a polymer to give a solution having a concentration of 0.01 g/ml which is designated as C. In an Ostwald's viscometer were placed 10 ml of this solution and the dropping time of the solution is measured and designated as n [sec]. Separately, 10 ml of N-methyl-2-pyrrolidone alone were placed in the Ostwald's viscometer and the dropping time of the solution is measured and designated as $n_o$ [sec]. The viscosity number is defined by the following equation and is calculated from it.

$$\text{Viscosity Number} = \frac{1}{C}\left(\frac{\eta - \eta_0}{\eta_0}\right)$$

Syntheses of (1-1) Polymers in Table 2

In a 500 ml separable flask were placed 21.8 g of pyromellitic dianhydride, 27.0 g of 2-hydroxyethyl methacrylate and 100 ml of γ-butyrolactone, and to the mixture were added 17.0 g of pyridine under cooling with ice with stirring. Stirring of the mixture thus obtained was continued for 16 hours at 20° C., and then 40 ml of a γ-butyrolactone solution containing 41.2 g of dicyclohexylcarbodiimide was added thereto over a period of 10 minutes under cooling with ice, followed by the addition of 35 ml of a γ-butyrolactone suspension containing 17.2 g of 4,4'-diaminodiphenylether over a period of 20 minutes. After this mixed reaction solution was stirred at 20° C. for 3 hours, 5 ml of ethanol was added thereto and stirring was continued for one hour. The reaction solution thus obtained was filtered and the filtrate was added dropwise to 5 l of ethanol with vigorous stirring. The precipitates formed were isolated by filtration by means of suction and dried under vacuum to give a polymer of yellowish powder. This polymer is designated as P-1.

In the same manner as described above, the polymers designated as P-2 to P-7 were prepared by using the alcohols, acid anhydrides and amines as set forth in Table 2.

TABLE 2

| Polymer No. | (1-1) Polymers Starting Materials | | | | | | Viscosity Number |
|---|---|---|---|---|---|---|---|
| | Alcohol | (g) | Acid anhydride | (g) | Amine | (g) | |
| P-1 | 2-HEMA*1 | (27.0) | PMDA*3 | (21.8) | 4,4'-Diaminodiphenyl- | (17.2) | 15.4 |

TABLE 2-continued

| Polymer No. | Alcohol | (g) | Acid anhydride | (g) | Amine | (g) | Viscosity Number |
|---|---|---|---|---|---|---|---|
| P-2 | " | " | BTDA*4 | (32.2) | 4,4'-Diaminodiphenyl-ether | " | 14.3 |
| P-3 | " | " | PMDA<br>BTDA | (10.9)<br>(16.1) | 4,4'-Diaminodiphenyl-ether | " | 15.1 |
| P-4 | " | " | PMDA<br>BTDA | (6.5)<br>(22.5) | 4,4'-Diaminodiphenyl-ether | " | 15.0 |
| P-5 | 2-HPA*2 | (27.0) | PMDA<br>BTDA | (10.9)<br>(16.1) | 4,4'-Diaminodiphenyl-ether | " | 14.9 |
| P-6 | " | " | PMDA<br>BTDA | (6.5)<br>(22.5) | 4,4'-Diamino-3,3'-biphenyldicarboxamide | (23.8) | 14.4 |
| P-7 | " | " | PMDA<br>BTDA | (6.5)<br>(22.5) | 2,5-Diaminobenzamide | (13.3) | 14.6 |

*1 2-HEMA: 2-Hydroxyethyl methacrylate
*2 2-HPA: 2-Hydroxypropyl acrylate
*3 PMDA: Pyromellitic dianhydride
*4 BTDA: 3,3',4,4'-Benzophenonetetracarboxylic dianhydride

SYNTHESES OF (1-2) POLYMERS IN TABLE 3

In a 500 ml separable flask were placed 24.0 g of 3,3'-dicarboxy-4,4'-diaminobiphenyl and 120 g of N,N-dimethylacetamide, and to the mixture were added 100 g of an N,N-dimethylacetamide solution containing 25.0 g of 4,4'-diphenylmethane diisocyanate under cooling with ice with stirring. After this reaction solution was stirred at 20° C. for 2 hours, 30.0 g of glycidyl methacrylate, 3.0 g of benzyldimethylamine and 0.3 g of hydroquinone were added thereto. The reaction mixture solution was heated at a temperature of 50° C. to 60° C. for 23 hours with stirring and then added dropwise to 5 l of ethanol with vigorous stirring. The precipitates formed were isolated by filtration by means of suction and dried under vacuum at 20° C. to give a polymer of yellowish powder. This polymer is designated at P-8.

In the same manner as described above, the polymer designated at P-9 was prepared by using the epoxy compound, isocyanate and amine as set forth in Table 3.

SYNTHESES OF (1-3) POLYMERS IN TABLE 4

In a 500 ml separable flask were placed 24.0 g of 2,5-dihydroxybenzoic acid and 160 g of N-methyl-2-pyrrolidone, and to the mixture were added 140 g of a N-methyl-2-pyrrolidone solution containing 25.0 g of 4,4'-diphenylmethane diisocyanate with stirring. The reaction mixture solution thus obtained was heated at a temperature of 30° C. to 40° C. for 12 hours with stirring. After 2 ml of ethanol were added to the reaction solution and the mixture solutin was stirred at 20° C. for 2 hours, 27.7 g of dimethylaminoethyl methacrylate were added thereto, and the mixture solution thus obtained was stirred for 2 hours to give a polymer dope. The polymer thus obtained was designated as P-10.

In the same manner as described above, an N-methyl-2-pyrrolidone solution containing the polymer designated at P-11 was prepared using the alcohol, isocyanate and amine as set forth in Table 4.

TABLE 3

| Polymer No. | Epoxy Compound | (g) | Isocyanate | (g) | Amine | (g) | Viscosity Number |
|---|---|---|---|---|---|---|---|
| P-8 | Glycidyl methacrylate | (30.0) | 4,4'-Diphenylmethane diisocyanate | (25.0) | 3,3'-Dicarboxy-4,4'-diaminobiphenyl | (24.0) | 15.5 |
| P-9 | " | " | Tolylene-2,4-diisocyanate | (17.4) | 3,3'-Dicarboxy-4,4'-diaminobiphenyl | " | 15.3 |

TABLE 4

| Polymer No. | Alcohol | (g) | Isocyanate | (g) | Amine | (g) | Viscosity Number |
|---|---|---|---|---|---|---|---|
| P-10 | 2,5-Dihydroxybenzoic acid | (24.0) | 4,4'-Diphenylmethane diisocyanate | (25.0) | Dimethylaminoethyl methacrylate | (27.7) | 17.7 |
| P-11 | 2,5-Dihydroxybenzoic acid | " | Tolylene-2,4-diisocyanate | (17.4) | Dimethylaminoethyl methacrylate | " | 18.5 |

TABLE 5

| Compound Having A Terminal Ethylenically Unsaturated Group | |
|---|---|
| No. | Compound |
| M-1 | Trimethylolpropane triacrylate |
| M-2 | Tetraethyleneglycol diacrylate |
| M-3 | Methylenebisacrylamide |

TABLE 6
| No. | Oxime Ester Compound |
|---|---|
| K-1 | 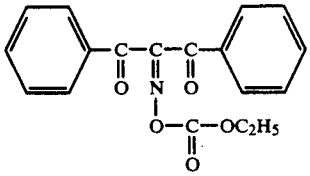 |
| K-2 | 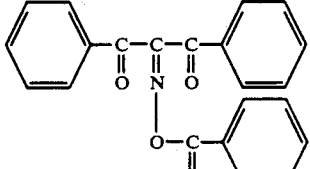 |
| K-3 | 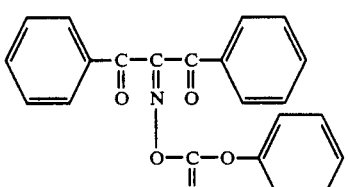 |
| K-4 | 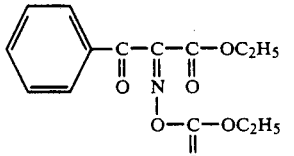 |
| K-5 | 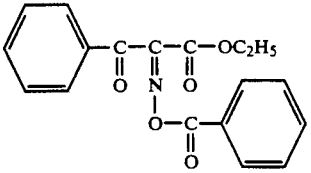 |
| K-6 | 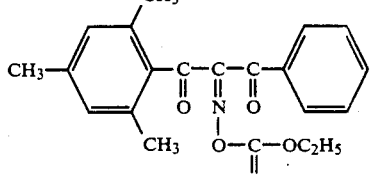 |
| K-7 | 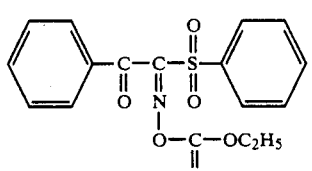 |
| K-8 | 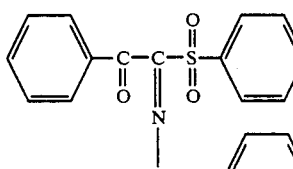 |
TABLE 7
| No. | Coumarin Compound |
|---|---|
| B-1 | 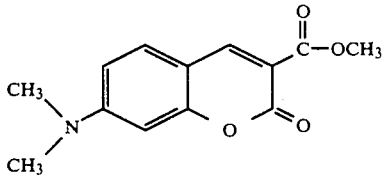 |
| B-2 | 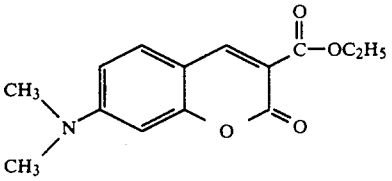 |
| B-3 | 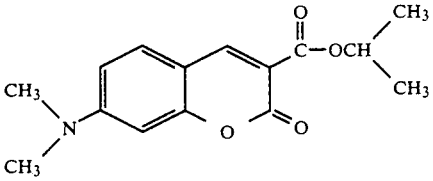 |

TABLE 7-continued

| Coumarin Compound | |
|---|---|
| No. | Compound |
| B-4 | 3-(benzyloxycarbonyl-carbonyl)-7-dimethylaminocoumarin |
| B-5 | 3-methoxycarbonyl-7-diethylaminocoumarin |
| B-6 | 3-ethoxycarbonyl-7-diethylaminocoumarin |
| B-7 | 3-acetyl-7-diethylaminocoumarin |
| B-8 | 3-benzoyl-7-dimethylaminocoumarin |
| B-9 | 3-ethoxycarbonyl julolidine-coumarin |
| B-10 | 3-cyano julolidine-coumarin |
| B-11 | 3-acetyl julolidine-coumarin |

TABLE 7-continued

| No. | Coumarin Compound<br>Compound |
|---|---|
| B-12 | (structure: 7-diethylamino coumarin with benzimidazole substituent, NH) |
| B-13 | (structure: 7-diethylamino coumarin with N-methyl benzimidazole substituent) |
| B-14 | (structure: 7-diethylamino-4-methylcoumarin) |
| B-15 | (structure: bis(7-diethylamino coumarin) linked via carbonyl bridge) |

TABLE 8

| No. | Aromatic Amine Compound<br>Compound |
|---|---|
| S-1 | N-Phenyldiethanolamine |
| S-2 | N-p-Tolyldiethanolamine |
| S-3 | 4-Morpholinobenzophenone |

TABLE 9

| No. | Mercapto-Containing Aromatic Heterocyclic Compound<br>Compound |
|---|---|
| A-1 | 2-Mercaptobenzimidazole |
| A-2 | 1-Phenyl-5-mercapto-1H-tetrazole |
| A-3 | 2-Mercaptobenzthiazole |

TABLE 10

| No. | Silane Compound<br>Compound |
|---|---|
| D-1 | 3-Methacryloxypropyltrimethoxysilane |
| D-2 | 3-Methacryloxypropyldimethoxymethylsilane |
| D-3 | Diethoxy-3-glycidoxypropylmethylsilane |
| D-4 | 3-Methacryloxypropyltriethoxysilane |

TABLE 11

| No. | Polymerization Inhibitor<br>Compound |
|---|---|
| Z-1 | N-Nitrosodiphenylamine |
| Z-2 | p-tert-Butylcatechol |

TABLE 11-continued

| No. | Polymerization Inhibitor<br>Compound |
|---|---|
| Z-3 | 2,6-Di-tert-butyl-p-methylphenol |

EXAMPLES 1 to 41 and 46 to 67

To 100 parts by weight of the polymer as set forth in Table 12 were added the compound having a terminal ethylenically unsaturated group, the oxime ester compound, the coumarin compound and, if indicated, the aromtic amine compound, the mercapto-containing heterocyclic compound, the silane compound and the polymerization inhibitor in an amount by parts by weight as set forth in Table 12, and the mixture was dissolved in 130 parts by weight of N-methylpyrrolidone to give a solution. The solution thus obtained was spin-coated on a silicon wafer at 2,000 r.p.m. for 30 seconds and dried in air at 70° C. for 90 minutes to give a uniform coating having a thickness of about 20 μm.

Then the coated silicon wafer was exposed through a photomask bearing a test pattern to g-line using a g-line stepper (manufactured by Canon Koki K.K., "FPA 1550 M II", illuminance at the surface of the silicon wafer: 520 mW/cm²). Then the exposed silicon wafer was left to stand at 20° C. for one hour, developed with a mixed solution of N-methylpyrrolidone and xylene of a volume ratio of 1:1, rinsed with isopropyl alcohol and dried. The photosensitivity was obtained from the exposure dose which clearly resolved the line and space part of 20 μm in the test pattern. The photosensitivity is higher with decreased exposure doses.

The results thus obtained are set forth in Table 12.

EXAMPLES 42 to 45

To an N-methylpyrrolidone solution containing 100 parts by weight of polymer P-10 or P-11 were added the compound having a terminal ethylenically unsaturated group, the oxime ester compound, the coumarin compound, the aromatic amine compound, the mercapto-containing heterocyclic compound, the silane compound and the polymerization inhibitor in an amount by parts by weight as set forth in Table 12 to give a solution. The solution thus obtained was spin-coated on a silicon wafer at 700 r.p.m. for 30 seconds and dried in air at 70° C. for 90 minutes to give a uniform coating having a thickness of 15 m with polymer P-10 or 13 m with polymer P-11. In the same manner as in Examples 1 to 41 the exposure to g-line, development, rinsing and drying were conducted and the photosensitivity was obtained from the exposure dose which clearly resolved the line and space part of 16 m in the test pattern.

The results thus obtained are set forth in Table 12.

TABLE 12

| Example No. | Polymer No. | Compound having a terminal ethylenically unsaturated group (parts by weight) | Oxime Ester Compound (parts by weight) | Coumarin Compound (parts by weight) | Aromatic Amine Compound (parts by weight) | Mercapto-Containing Heterocyclic Compound (parts by weight) | Silane Compound (parts by weight) | Polymerization Inhibitor (parts by weight) | Photosensitivity (mJ/cm²) |
|---|---|---|---|---|---|---|---|---|---|
| 1 | P-1 | M-1 (6) | K-1 (3) | B-1 (0.4) | S-1 (2) | A-1 (2) | D-1 (2) | Z-1 (0.1) | 520 |
| 2 | " | M-1 (6) | K-1 (3) | B-1 (0.4) | S-1 (2) | A-1 (2) | D-1 (2) | — | " |
| 3 | " | M-1 (6) | K-1 (3) | B-1 (0.4) | S-1 (2) | A-1 (2) | — | — | " |
| 4 | " | M-1 (6) | K-1 (8) | B-1 (0.4) | S-1 (2) | — | D-1 (2) | Z-1 (0.1) | 572 |
| 5 | " | M-1 (6) | K-1 (6) | B-1 (0.4) | — | A-1 (2) | D-1 (2) | Z-1 (0.1) | 520 |
| 6 | " | M-1 (10) | K-1 (10) | B-1 (0.4) | — | — | D-1 (2) | Z-1 (0.1) | 572 |
| 7 | " | M-1 (10) | K-1 (10) | B-1 (0.4) | — | — | — | — | " |
| 8 | " | M-1 (3) | K-1 (5) | B-1 (0.6) | S-1 (2) | A-1 (2) | D-1 (2) | Z-1 (0.1) | 520 |
| 9 | " | M-1 (10) | K-1 (1.5) | B-1 (0.6) | S-1 (2) | A-1 (2) | D-1 (2) | Z-1 (0.1) | " |
| 10 | " | M-1 (6) | K-1 (3) | B-2 (0.4) | S-1 (2) | A-1 (2) | D-2 (2) | Z-1 (0.1) | " |
| 11 | " | M-2 (6) | K-1 (3) | B-3 (0.4) | S-1 (2) | A-2 (2) | D-3 (2) | Z-1 (0.1) | " |
| 12 | " | M-2 (6) | K-1 (3) | B-3 (0.4) | S-1 (2) | A-2 (2) | D-3 (2) | — | " |
| 13 | " | M-2 (6) | K-1 (3) | B-3 (0.4) | S-1 (2) | A-2 (2) | — | — | " |
| 14 | " | M-2 (6) | K-1 (8) | B-3 (0.4) | S-1 (2) | — | — | — | 572 |
| 15 | " | M-2 (10) | K-1 (10) | B-3 (0.4) | — | — | — | — | " |
| 16 | " | M-2 (6) | K-1 (3) | B-4 (0.4) | S-1 (2) | A-2 (2) | D-2 (2) | Z-1 (0.1) | 520 |
| 17 | " | M-3 (6) | K-1 (3) | B-5 (0.4) | S-1 (2) | A-3 (2) | D-2 (2) | Z-1 (0.1) | " |
| 18 | " | M-3 (6) | K-1 (3) | B-6 (0.4) | S-1 (2) | A-3 (2) | D-2 (2) | Z-1 (0.1) | " |
| 19 | P-2 | M-2 (6) | K-2 (3) | B-6 (0.4) | S-2 (2) | A-2 (2) | D-2 (2) | Z-1 (0.1) | 572 |
| 20 | " | M-2 (6) | K-2 (3) | B-6 (0.4) | S-2 (2) | A-2 (2) | — | — | " |
| 21 | P-3 | M-2 (6) | K-2 (3) | B-6 (0.4) | S-2 (2) | A-2 (2) | D-2 (2) | Z-1 (0.1) | " |
| 22 | " | M-2 (6) | K-2 (3) | B-6 (0.4) | S-2 (2) | A-2 (2) | — | — | " |
| 23 | P-4 | M-2 (6) | K-2 (3) | B-6 (0.4) | S-2 (2) | A-2 (2) | D-2 (2) | Z-1 (0.1) | " |
| 24 | " | M-2 (6) | K-2 (3) | B-6 (0.4) | S-2 (2) | A-2 (2) | — | — | " |
| 25 | P-5 | M-2 (6) | K-2 (3) | B-6 (0.4) | S-2 (2) | A-2 (2) | D-2 (2) | Z-2 (0.2) | 520 |
| 26 | P-4 | M-1 (6) | K-2 (3) | B-3 (0.4) | S-3 (2) | A-2 (2) | D-2 (2) | Z-1 (0.1) | 572 |
| 27 | " | M-1 (6) | K-3 (3) | B-3 (0.4) | S-3 (2) | A-2 (2) | D-2 (2) | Z-1 (0.1) | 520 |
| 28 | " | M-1 (6) | K-4 (3) | B-3 (0.4) | S-3 (2) | A-2 (2) | D-2 (2) | Z-1 (0.1) | 572 |
| 29 | " | M-1 (6) | K-5 (3) | B-3 (0.4) | S-3 (2) | A-2 (2) | D-2 (2) | Z-1 (0.1) | " |
| 30 | " | M-1 (6) | K-6 | B-3 | S-3 | A-2 | D-2 | Z-1 | " |

TABLE 12-continued

| Example No. | Polymer No. | Compound having a terminal ethylenically unsaturated group (parts by weight) | Oxime Ester Compound (parts by weight) | Coumarin Compound (parts by weight) | Aromatic Amine Compound (parts by weight) | Mercapto-Containing Hetero-cyclic Compound (parts by weight) | Silane Compound (parts by weight) | Polymerization Inhibitor (parts by weight) | Photosensitivity (mJ/cm$^2$) |
|---|---|---|---|---|---|---|---|---|---|
| | | (6) | (3) | (0.4) | (2) | (2) | (2) | (0.1) | |
| 31 | " | M-1 | K-7 | B-3 | S-3 | A-2 | D-2 | Z-1 | 478 |
| | | (6) | (3) | (0.4) | (2) | (2) | (2) | (0.1) | |
| 32 | " | M-1 | K-8 | B-3 | S-3 | A-2 | D-2 | Z-1 | " |
| | | (6) | (3) | (0.4) | (2) | (2) | (2) | (0.1) | |
| 33 | P-2 | M-2 | K-8 | B-4 | S-1 | A-2 | D-2 | Z-1 | " |
| | | (2) | (3) | (0.4) | (2) | (2) | (2) | (0.1) | |
| 34 | P-6 | M-2 | K-2 | B-6 | S-2 | A-2 | D-2 | Z-2 | 520 |
| | | (6) | (3) | (0.4) | (2) | (2) | (2) | (0.2) | |
| 35 | " | M-2 | K-1 | B-6 | S-2 | A-2 | — | — | " |
| | | (6) | (3) | (0.4) | (2) | (2) | | | |
| 36 | P-7 | M-2 | K-2 | B-6 | S-2 | A-2 | D-2 | Z-1 | " |
| | | (6) | (3) | (0.4) | (2) | (2) | (2) | (0.1) | |
| 37 | " | M-1 | K-1 | B-5 | S-1 | A-2 | — | — | " |
| | | (6) | (3) | (0.4) | (2) | (2) | | | |
| 38 | P-8 | M-2 | K-1 | B-6 | S-1 | A-2 | D-1 | Z-1 | " |
| | | (6) | (3) | (0.4) | (2) | (2) | (2) | (0.1) | |
| 39 | " | M-1 | K-6 | B-2 | S-2 | A-1 | D-2 | Z-2 | 572 |
| | | (6) | (3) | (0.4) | (2) | (2) | (2) | (0.1) | |
| 40 | P-9 | M-2 | K-1 | B-6 | S-1 | A-2 | D-2 | Z-1 | 520 |
| | | (6) | (3) | (0.4) | (2) | (2) | (2) | (0.1) | |
| 41 | " | M-1 | K-6 | B-2 | S-3 | A-3 | D-3 | Z-2 | 572 |
| | | (6) | (3) | (0.4) | (3) | (2) | (2) | (0.1) | |
| 42 | P-10 | M-2 | K-1 | B-6 | S-1 | A-2 | D-3 | Z-2 | 520 |
| | | (6) | (3) | (0.4) | (2) | (2) | (2) | (0.1) | |
| 43 | " | M-3 | K-7 | B-3 | S-2 | A-3 | D-2 | Z-1 | 572 |
| | | (6) | (3) | (0.4) | (2) | (2) | (2) | (0.1) | |
| 44 | P-11 | M-3 | K-4 | B-4 | S-2 | A-3 | D-1 | Z-1 | " |
| | | (6) | (3) | (0.4) | (2) | (2) | (2) | (0.1) | |
| 45 | " | M-1 | K-8 | B-5 | S-1 | A-2 | D-2 | Z-2 | 520 |
| | | (6) | (3) | (0.4) | (2) | (2) | (2) | (0.1) | |
| 46 | P-3 | M-2 | K-1 | B-7 | S-1 | A-2 | D-4 | Z-1 | 960 |
| | | (6) | (3) | (0.4) | (2) | (2) | (2) | (0.1) | |
| 47 | P-4 | M-1 | K-2 | B-7 | S-3 | A-3 | D-2 | Z-3 | 1050 |
| | | (6) | (3) | (0.4) | (2) | (2) | (2) | (0.1) | |
| 48 | " | M-1 | K-2 | B-7 | S-3 | A-3 | — | — | " |
| | | (6) | (3) | (0.4) | (2) | (2) | | | |
| 49 | " | M-2 | K-7 | B-8 | S-1 | A-2 | D-4 | Z-3 | 960 |
| | | (6) | (3) | (0.4) | (2) | (2) | (2) | (0.1) | |
| 50 | P-5 | M-2 | K-7 | B-8 | S-1 | A-2 | — | — | " |
| | | (6) | (3) | (0.4) | (2) | (2) | | | |
| 51 | P-4 | M-2 | K-1 | B-9 | S-1 | A-1 | D-4 | Z-3 | 1050 |
| | | (6) | (3) | (0.4) | (2) | (2) | (2) | (0.1) | |
| 52 | P-1 | M-1 | K-1 | B-9 | S-1 | A-2 | D-2 | Z-2 | 1200 |
| | | (6) | (3) | (0.4) | (2) | (2) | (2) | (0.1) | |
| 53 | " | M-1 | K-1 | B-9 | S-1 | A-2 | — | — | " |
| | | (6) | (3) | (0.4) | (2) | (2) | | | |
| 54 | P-4 | M-2 | K-1 | B-10 | S-2 | A-2 | D-1 | Z-1 | 1050 |
| | | (6) | (3) | (0.4) | (2) | (2) | (2) | (0.1) | |
| 55 | P-6 | M-2 | K-1 | B-10 | S-2 | A-2 | — | — | " |
| | | (6) | (3) | (0.4) | (2) | (2) | | | |
| 56 | P-7 | M-2 | K-7 | B-10 | S-2 | A-2 | — | — | " |
| | | (6) | (3) | (0.4) | (2) | (2) | | | |
| 57 | P-4 | M-3 | K-3 | B-11 | S-3 | A-3 | D-4 | Z-3 | 1200 |
| | | (6) | (3) | (0.4) | (2) | (2) | (2) | (0.1) | |
| 58 | " | M-3 | K-3 | B-11 | S-3 | A-3 | — | — | " |
| | | (6) | (3) | (0.4) | (2) | (2) | | | |
| 59 | " | M-3 | K-4 | B-12 | S-3 | A-1 | D-2 | Z-2 | " |
| | | (6) | (3) | (0.4) | (2) | (2) | (2) | (0.1) | |
| 60 | " | M-3 | K-4 | B-12 | S-3 | A-1 | — | — | " |
| | | (6) | (3) | (0.4) | (2) | (2) | | | |
| 61 | " | M-2 | K-8 | B-13 | S-1 | A-2 | D-4 | Z-1 | 960 |
| | | (6) | (3) | (0.4) | (2) | (2) | (2) | (0.1) | |
| 62 | P-6 | M-2 | K-8 | B-13 | S-1 | A-2 | — | — | " |
| | | (6) | (3) | (0.4) | (2) | (2) | | | |
| 63 | P-3 | M-3 | K-5 | B-13 | S-2 | A-2 | D-2 | Z-3 | 1050 |
| | | (6) | (3) | (0.4) | (2) | (2) | (2) | (0.1) | |
| 64 | P-4 | M-2 | K-1 | B-14 | S-1 | A-2 | D-1 | Z-2 | 1200 |
| | | (6) | (3) | (0.4) | (2) | (2) | (2) | (0.1) | |
| 65 | P-2 | M-2 | K-1 | B-14 | S-1 | A-2 | — | — | " |
| | | (6) | (3) | (0.4) | (2) | (2) | | | |
| 66 | P-4 | M-2 | K-1 | B-15 | S-1 | A-2 | D-1 | Z-3 | " |
| | | (6) | (3) | (0.4) | (2) | (2) | (2) | (0.1) | |
| 67 | P-1 | M-2 | K-1 | B-15 | S-1 | A-2 | — | — | " |

TABLE 12-continued

| Example No. | Polymer No. | Compound having a terminal ethylenically unsaturated group (parts by weight) | Oxime Ester Compound (parts by weight) | Coumarin Compound (parts by weight) | Aromatic Amine Compound (parts by weight) | Mercapto-Containing Heterocyclic Compound (parts by weight) | Silane Compound (parts by weight) | Polymerization Inhibitor (parts by weight) | Photosensitivity (mJ/cm$^2$) |
|---|---|---|---|---|---|---|---|---|---|
| | | (6) | (3) | (0.4) | (2) | (2) | | | |

COMPARATIVE EXAMPLES 1 to 16

The procedures of Examples 1 to 41 were repeated using the polymer and, if indicated, the compound having a terminal ethylenically unsaturated group, the oxime ester compound, the coumarin compound, the aromatic amine compound, the mercapto-containing heterocyclic compound, the silane compound and the polymerization inhibitor in an amount as set forth in Table 13.

The results are set forth in Table 13.

COMPARATIVE EXAMPLES 17 to 31

The procedures of Examples 1 to 41 were repeated using the polymer, the compound having a terminal ethylenically unsaturated group, the oxime ester compound, the photosensitizer instead of the coumarin compound of the present invention, the aromatic amine compound, the mercapto-containing heterocyclic compound, the silane compound and the polymerization inhibitor in an amount as set forth in Table 14.

The results are set forth in Table 14.

TABLE 13

| Comparative Example No. | Polymer No. (100 parts by weight) | Compound having a terminal ethylenically unsaturated group (parts by weight) | Oxime Ester Compound (parts by weight) | Coumarin Compound (parts by weight) | Aromatic Amine Compound (parts by weight) | Mercapto-Containing Aromatic Heterocyclic Compound (parts by weight) | Silane Compound (parts by weight) | Polymerization Inhibitor (parts by weight) | Photosensitivity (mJ/cm$^2$) |
|---|---|---|---|---|---|---|---|---|---|
| 1 | P-1 | M-1 (6) | — | — | S-1 (2) | A-1 (2) | D-1 (2) | Z-1 (0.1) | >1560*[1] |
| 2 | " | M-2 (6) | — | — | S-2 (2) | A-2 (2) | D-2 (2) | Z-1 (0.1) | " |
| 3 | " | M-3 (10) | — | — | S-3 (2) | A-3 (3) | D-3 (2) | Z-1 (0.1) | " |
| 4 | " | M-2 (10) | — | — | S-2 (4) | A-2 (4) | D-2 (2) | Z-1 (0.1) | " |
| 5 | " | M-2 (6) | K-1 (3) | — | S-1 (2) | A-2 (2) | D-2 (2) | Z-1 (0.1) | " |
| 6 | " | M-2 (6) | K-2 (3) | — | S-1 (2) | A-2 (2) | D-2 (2) | Z-1 (0.1) | " |
| 7 | " | M-2 (6) | K-3 (3) | — | S-1 (2) | A-2 (2) | D-2 (2) | Z-1 (0.1) | " |
| 8 | " | M-2 (6) | K-1 (10) | — | S-1 (2) | A-2 (2) | D-2 (2) | Z-1 (0.1) | " |
| 9 | " | M-2 (6) | — | B-2 (0.4) | S-1 (2) | A-2 (2) | D-2 (2) | Z-1 (0.1) | " |
| 10 | " | M-2 (6) | — | B-4 (0.4) | S-1 (2) | A-2 (2) | D-2 (2) | Z-1 (0.1) | " |
| 11 | " | M-2 (6) | — | B-6 (0.4) | S-1 (2) | A-2 (2) | D-2 (2) | Z-1 (0.1) | " |
| 12 | " | M-2 (10) | — | B-6 (0.6) | S-1 (4) | A-2 (4) | D-2 (2) | Z-1 (0.1) | " |
| 13 | " | — | K-4 (3) | B-1 (0.4) | S-1 (2) | A-2 (2) | D-2 (2) | Z-1 (0.1) | " |
| 14 | " | — | K-5 (3) | B-2 (0.4) | S-1 (2) | A-2 (2) | D-2 (2) | Z-1 (0.1) | " |
| 15 | " | — | K-6 (3) | B-3 (0.4) | S-1 (2) | A-2 (2) | D-2 (2) | Z-1 (0.1) | " |
| 16 | " | — | K-6 (6) | B-1 (0.6) | S-1 (4) | A-2 (4) | D-2 (2) | Z-1 (0.1) | " |

*[1] Clear patterns could not be obtained even with an exposure dose of 1560 mJ/cm$^2$.

COMPARATIVE EXAMPLE 32

The procedures of Examples 42 to 45 were repeated using the polymer, the compound having a terminal ethylenically unsaturated group, the oxime ester compound, 2-(4'-dimethylaminophenylvinylene)benzothiazole instead of the coumarin compound of the present invention, the aromatic amine compound, the mercapto-containing heterocyclic compound, the silane compound and the polymerization inhibitor in an amount as set forth in Table 14.

The result is set forth in Table 14.

COMPARATIVE EXAMPLES 33 to 38

The procedures of Examples 1 to 41 were repeated using the polymer, the compound having a terminal ethyleniclly unsaturated group, the photopolymerization initiator instead of the oxime ester compound of the present invention, the coumarine compound, the aromatic amine compound, the mercapto-containing heterocyclic compound, the silane compound and the polymerization inibitor in an amount as set forth in Table 15.

The results are shown set forth in Table 15.

TABLE 14

| Comparative Example No. | Polymer No. (100 parts by weight) | Compound having a terminal ethylenically unsaturated group (parts by weight) | Oxime Ester Compound (parts by weight) | Photosensitizer (parts by weight) | Aromatic Amine Compound (parts by weight) | Mercapto-Containing Aromatic Heterocyclic Compound (parts by weight) | Silane Compound (parts by weight) | Polymerization Inhibitor (parts by weight) | Photosensitivity (mJ/cm$^2$) |
|---|---|---|---|---|---|---|---|---|---|
| 17 | P-1 | M-1 (6) | K-1 (3) | B-16[*2] (0.4) | S-1 (2) | A-1 (2) | D-1 (2) | Z-1 (0.1) | >1560[*1] |
| 18 | P-2 | M-2 (6) | K-2 (3) | B-16[*2] (0.4) | S-2 (2) | A-2 (2) | D-2 (2) | Z-1 (0.1) | " |
| 19 | P-1 | M-1 (6) | K-1 (3) | B-16[*2] (0.4) | S-1 (2) | A-1 (2) | — | — | " |
| 20 | P-2 | M-2 (6) | K-2 (3) | B-16[*2] (0.4) | S-2 (2) | A-2 (2) | — | — | " |
| 21 | P-3 | M-2 (6) | K-7 (3) | B-17[*3] (0.4) | S-1 (2) | A-2 (2) | D-2 (2) | Z-2 (0.1) | " |
| 22 | P-4 | M-2 (6) | K-8 (3) | B-17[*3] (0.4) | S-1 (2) | A-2 (2) | D-1 (2) | Z-2 (0.1) | " |
| 23 | P-3 | M-2 (6) | K-2 (3) | B-18[*4] (0.4) | S-2 (2) | A-2 (2) | D-2 (2) | Z-1 (0.1) | " |
| 24 | " | M-1 (6) | K-3 (3) | B-18[*4] (0.4) | S-2 (2) | A-1 (2) | D-4 (2) | Z-1 (0.1) | " |

[*1] B-1: Clear patterns could not be obtained even with an exposure dose of 1560 mJ/cm$^2$.
[*2] B-16: 4,4'-Bis(diethylamino)benzophenone
[*3] B-17: Michler's ketone
[*4] B-18: 2,6-Bis(4'-dimethylaminobenzal)-4-methylcyclohexanone

| Comparative Example No. | Polymer No. | Compound having a terminal ethylenically unsaturated group | Oxime Ester Compound | Photosensitizer | Aromatic Amine Compound | Mercapto-Containing Aromatic Heterocyclic Compound | Silane Compound | Polymerization Inhibitor | Photosensitivity |
|---|---|---|---|---|---|---|---|---|---|
| 25 | P-4 | M-1 (6) | K-4 (3) | B-19[*2] (0.4) | S-3 (2) | A-2 (2) | D-2 (2) | Z-1 (0.1) | " |
| 26 | " | M-2 (6) | K-5 (3) | B-19[*2] (0.4) | S-1 (2) | A-1 (2) | D-2 (2) | Z-2 (0.1) | " |
| 27 | P-6 | M-2 (6) | K-2 (3) | B-20[*3] (0.4) | S-2 (2) | A-2 (2) | D-2 (2) | Z-2 (0.1) | " |
| 28 | " | M-2 (6) | K-2 (3) | B-20[*3] (0.4) | S-2 (2) | A-2 (2) | — | — | " |
| 29 | P-7 | M-1 (6) | K-1 (3) | B-20[*3] (0.4) | S-1 (2) | A-2 (2) | — | — | " |
| 30 | P-5 | M-2 (6) | K-2 (3) | B-21[*4] (0.4) | S-2 (2) | A-2 (2) | D-2 (2) | Z-2 (0.1) | " |
| 31 | P-8 | M-1 (6) | K-6 (3) | B-21[*4] (0.4) | S-2 (2) | A-1 (2) | D-2 (2) | Z-2 (0.1) | " |
| 32 | P-10 | M-2 (6) | K-1 (3) | B-21[*4] (0.4) | S-1 (2) | A-2 (2) | D-3 (2) | Z-2 (0.1) | " |

[*1] Clear patterns could not be obtained even with an exposure dose of 1560 mJ/cm$^2$.
[*2] B-19: 4,4'-Bis(dimethylamino)chalcone
[*3] B-20: 4-Dimethylaminobenzylideneindanone
[*4] B-21: 2-(4'-Dimethylaminophenylvinylene)benzothiazole

TABLE 15

| Comparative Example No. | Polymer No. (100 parts by weight) | Compound having a terminal ethylenically unsaturated group (parts by weight) | Photopolymerization Initiator (parts by weight) | Coumarin Compound (parts by weight) | Aromatic Amine Compound (parts by weight) | Mercapto-Containing Aromatic Heterocyclic Compound (parts by weight) | Silane Compound (parts by weight) | Polymerization Inhibitor (parts by weight) | Photosensitivity (mJ/cm$^2$) |
|---|---|---|---|---|---|---|---|---|---|
| 33 | P-1 | M-2 (6) | K-9[*2] (3) | B-3 (0.4) | S-1 (2) | A-2 (2) | D-3 (2) | Z-1 (0.1) | >1560[*1] |
| 34 | " | M-2 (6) | K-10[*3] (3) | B-3 (0.4) | S-1 (2) | A-2 (2) | D-3 (2) | Z-1 (0.1) | " |
| 35 | " | M-2 (6) | K-11[*4] (3) | B-3 (0.4) | S-1 (2) | A-2 (2) | D-3 (2) | Z-1 (0.1) | " |
| 36 | " | M-2 (6) | K-12[*5] (3) | B-3 (0.4) | S-1 (2) | A-2 (2) | D-3 (2) | Z-1 (0.1) | " |

TABLE 15-continued

| Comparative Example No. | Polymer No. (100 parts by weight) | Compound having a terminal ethylenically unsaturated group (parts by weight) | Photo- polymer- ization Initiator (parts by weight) | Coumarin Compound (parts by weight) | Aromatic Amine Compound (parts by weight) | Mercapto- Containing Aromatic Hetero- cyclic Compound (parts by weight) | Silane Compound (parts by weight) | Polymeriza- tion Inhibitor (parts by weight) | Photosensi- tivity (mJ/cm²) |
|---|---|---|---|---|---|---|---|---|---|
| 37 | " | M-2 (6) | K-13*⁶ (3) | B-3 (0.4) | S-1 (2) | A-2 (2) | D-3 (2) | Z-1 (0.1) | " |
| 38 | " | M-2 (6) | K-14*⁷ (3) | B-3 (0.4) | S-1 (2) | A-2 (2) | D-3 (2) | Z-1 (0.1) | " |

*¹Clear patterns could not be obtained even with an exposure dose of 1560 mJ/cm².
*²K-9: Benzophenone
*³K-10: Benzil
*⁴K-11: Benzoin isobutylether
*⁵K-12: Benzyldimethylketal
*⁶K-13: 1-Phenyl-1,2-propanedione-2-(0-ethoxycarbonyl)oxime
*⁷K-14: 1,2-Diphenyl-1,2-ethanedione-2-(0-benzoyl)oxime

What is claimed is:

1. A photosensitive composition comprising:
   (a) a polymer having recurring units represented by the formula

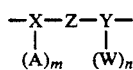     [I]

wherein
   X is a (2+m) valent $C_{6-30}$ carbocyclic group or heterocyclic group;
   Y is a (2+n) valent $C_{6-30}$ carbocyclic group or heterocyclic group;
   Z is

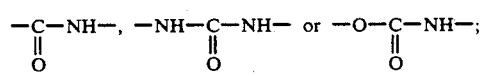

A is —COOR* or —COO⁻R**⁺ wherein each of R* and R** is a group having a carbon-carbon double bond;
   W is a group capable of reacting with the carbonyl group of A to form a ring on heating;
   A and W are arranged in ortho- or peri-position to Z;
   m is 1 or 2; and
   n is 0, 1 or 2,
   (b) 1 to 20% by weight, based on the weight of polymer (a), of a compound having a terminal ethylenically unsaturated group;
   (c) 0.1 to 20% by weight, based on the weight of polymer (a), of an oxime ester compound represented by the formula

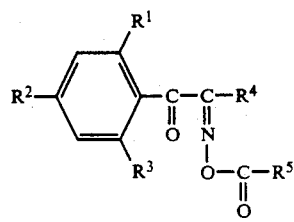   [II]

wherein
   each of $R^1$, $R^2$ and $R^3$ is a hydrogen atom, a $C_{1-6}$ alkyl group, a $C_{1-6}$ alkoxy group or a nitro group;
   $R^4$ is a $C_{7-11}$ aromatic acyl group, a $C_{2-7}$ aliphatic acyl group, a $C_{2-7}$ alkoxycarbonyl group, a $C_{6-10}$ aromatic sulfonyl group or a $C_{1-6}$ aliphatic sulfonyl group;
   $R^5$ is a $C_{1-6}$ alkyl group, a $C_{1-6}$ alkoxy group, a $C_{6-10}$ aromatic group or a $C_{6-10}$ aryloxy group; and
   (d) 0.01 to 10% by weight, based on the weight of polymer (a), of a coumarin compound represented by the formula

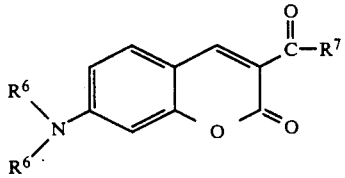

wherein
   $R^6$ is a methyl group or an ethyl group; and
   $R^7$ is a $C_{1-7}$ alkoxy group or benzyloxy group.

2. A photosensitive composition of claim 1 additionally comprising at most 10% by weight, based on the weight of polymer (a), of an aromatic compound represented by the formula

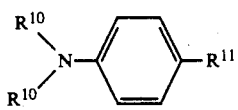

wherein
   $R^{10}$ is a $C_{1-3}$ alkyl group, a $C_{1-3}$ hydroxyalkyl group or a morpholino group; and
   $R^{11}$ is a $C_{1-3}$ alkyl group, a $C_{2-5}$ alkylcarbonyl group or a $C_{7-10}$ arylcarbonyl group.

3. A photosensitive composition of claim 1 or claim 2 further comprising at most 10% by weight, based on the weight of polymer (a), of a mercapto-containing aromatic heterocyclic compound.

4. A photosensitive composition of claim 1 additionally comprising 0.05 to 10% by weight, based on the weight of polymer (a), of a silane compound represented by the formula

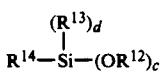

wherein
$R^{12}$ and $R^{13}$ each is a $C_{1-6}$ alkyl group;
$R^{14}$ is a hydrocarbon group which may have an oxygen atom, a nitrogen atom or a sulfur atom; and
c is 3 and d is zero or
c is 2 and d is one.

5. A photosensitive composition of claim 1 additionally comprising at most 5% by weight, based on the weight of polymer (a), of a polymerization inhibitor.

6. A photosensitive composition of claim 1, wherein X in formula [I] is a group selected from the group consisting of a tri- or tetra-valent benzene ring, a tri- or tetra-valent condensed polycyclic ring, a tri or tetra-valent heterocyclic ring and a group represented by the formula

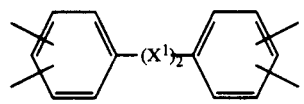 [Ia]

wherein
l is zero or one;
$X^1$ is

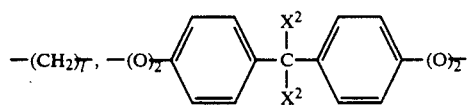

wherein l is zero or one

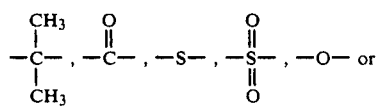

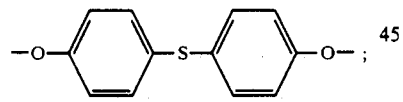

and
$X^2$ is —CH$_3$ or —CF$_3$.

7. A photosensitive composition of claim 6, wherein X in formula [I] is a tri- or tetra-valent benzene ring.

8. A photosensitive composition of claim 6, wherein X in formula [I] is a group represented by formula [Ia].

9. A photosensitive composition of claim 1, wherein Y in formula [I] is a group selected from the groups consisting of a di-, tri- or tetra-valent $C_{10-18}$ condensed polycyclic ring, a di-, tri- or tetra-valent heterocyclic ring and groups represented by the formulae

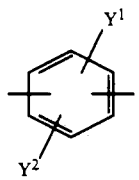 [Ib]

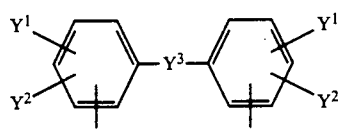 [Ic]

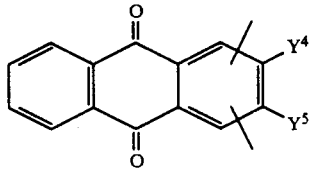 [Id]

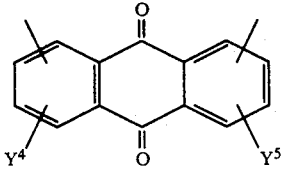 [Ie]

and

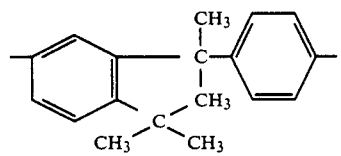 [If]

wherein
$Y^1$ and $Y^2$ each is a hydrogen atom, —CH$_3$, —C$_2$H$_5$, —CH(CH$_3$)$_2$, —OCH$_3$, —COOH, —NO$_2$, —CONH$_2$, —NH$_2$, a halogen atom or —SO$_3$H;
$Y^3$ is —(CH$_2$)$_p$—
wherein p is zero or one,

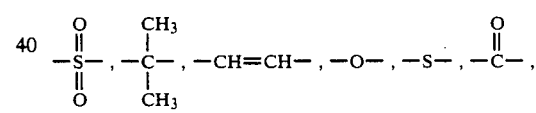

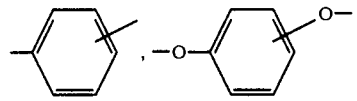

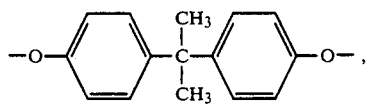

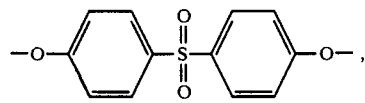

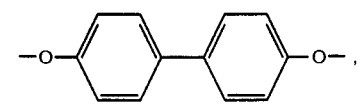

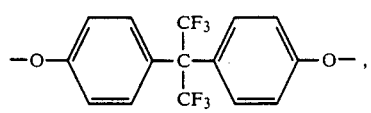

-continued

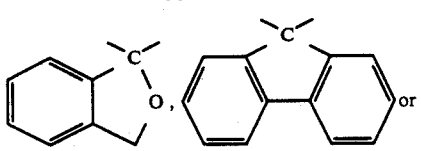

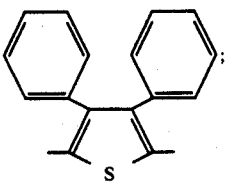

Y⁴ and Y⁵ each is a hydrogen atom, —CN, a halogen atom, —CH₃, —OCH₃, —SO₃H, —NH₂, —COOH or —CONH₂.

10. A photosensitive composition of claim 9, wherein Y in formula [I] is a group represented by formula [Ib].

11. A photosensitive composition of claim 9, wherein Y in formula [I] is a group represented by formula [Ic].

12. A photosensitive composition of claim 1, wherein z in formula [I] is

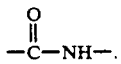

13. A photosensitive composition of claim 1, wherein R* in —COOR* of A in formula [I] is a group selected from the group consisting of groups represented by the formulae

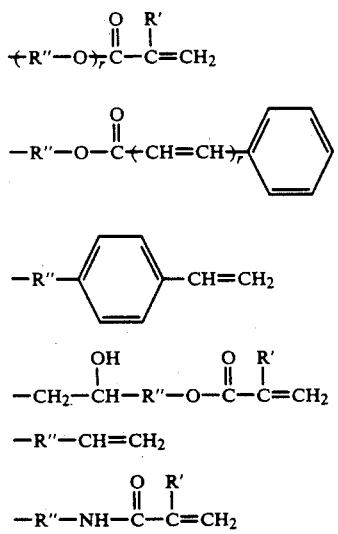

wherein
R' is a hydrogen atom or a methyl group;
R" is a C₁₋₃ alkylene group; and
r is one or two.

14. A photosensitive composition of claim 13, wherein R* in —COOR* of A in formula [I] is a group represented by formula [Ig].

15. A photosensitive composition of claim 13, wherein R* in —COOR* of A in formula [I] is a group represented by formula [Ij].

16. A photosensitive composition of claim 13, wherein R* in —COOR* of A in formula [I] is a group represented by formula [Il].

17. A photosensitive composition of claim 1, wherein R⊕ in —COO⊖R⊕ of A in formula [I] is a group represented by the formula

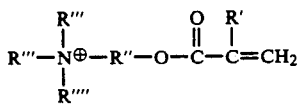

wherein
R' and R'''' each is a hydrogen atom or a methyl group;
R" is a C₁₋₃ alkylene group; and
R''' is a methyl group or an ethyl group.

18. A photosensitive composition of claim 1, wherein W in formula [I] is —NH₂ or

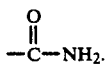

19. A photosensitive composition of claim 1, wherein the terminal ethylenically unsaturated group of compound (b) is represented by the formula

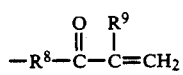

wherein
R⁸ is —O— or —NH—; and
R⁹ is a hydrogen atom or a methyl group.

20. A photosensitive composition of claim 1, wherein the compound having a terminal ethylenically unsaturated group (b) has a molecular weight of 60 to 1,000.

21. A photosensitive composition of claim 1, wherein in the oxime ester compound (c) of formula [II], R¹, R² and R³ each is a hydrogen atom, a methyl group, an ethyl group, a methoxy group, an ethoxy group or a nitro group; R⁴ is a benzoyl group, a toluoyl group, an acetyl group, a propionyl group, an ethoxycarbonyl group, a benzenesulfonyl group, a toluenesulfonyl group, a methanesulfonyl group or an ethanesulfonyl group; and R⁵ is an ethyl group, a butyl group, a methoxy group, an ethoxy group, a phenyl group, a tolyl group or a phenoxy group.

22. A photosensitive composition of claim 1, wherein the coumarin compound is a compound represented by the formula

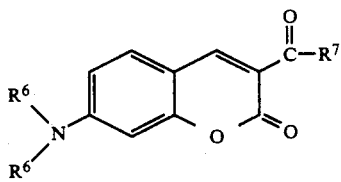

wherein
R⁶ is a methyl group or an ethyl group; and
R⁷ is a methoxy group, an ethoxy group, an n-propoxy group, an isopropoxy group, an n-butoxy group, an isobutoxy group, a tert-butoxy group or a benzyloxy group.

23. A photosensitive composition of claim 1 capable of forming fine patterns by an actinic light of a wave length of 330 to 550 nm.

24. A photosensitive composition of claim capable of forming fine patterns by an actinic light of a wave length of 436 nm from a mercury arc lamp.

* * * * *